United States Patent [19]

Glover et al.

[11] Patent Number: 4,839,896

[45] Date of Patent: Jun. 13, 1989

[54] FAST REMAINDER DECODING FOR A REED-SOLOMON CODE

[75] Inventors: Neal Glover, Broomfield; Trent Dudley, Littleton, both of Colo.

[73] Assignee: Data Systems Technology Corp., Broomfield, Colo.

[21] Appl. No.: 12,824

[22] Filed: Feb. 10, 1987

[51] Int. Cl.⁴ ............................................. G06F 11/10
[52] U.S. Cl. ............................................ 371/37; 371/39
[58] Field of Search ......................... 371/37, 38, 39, 40

[56] References Cited

U.S. PATENT DOCUMENTS

| | | | |
|---|---|---|---|
| 4,397,022 | 8/1983 | Weng | 371/37 |
| 4,468,769 | 8/1984 | Koga | 371/37 |
| 4,509,172 | 4/1985 | Chen | 371/38 |
| 4,644,543 | 2/1987 | Davis | 371/37 |

Primary Examiner—Michael R. Fleming
Attorney, Agent, or Firm—James R. Young

[57] ABSTRACT

Apparatus and methods are disclosed for providing fast decoding of Reed-Solomon and related codes. Cases of one and two data symbol errors are decoded directly from the remainder using a large pre-computed table without calculating syndromes. Techniques for decoding cases of more than two errors are given where an optimized Chien search is used when more than four errors remain; when four or fewer errors remain, the Chien search is eliminated in favor of locating an error by direct solution of the error locator polynomial. The error locator and syndrome polynomials are adjusted after each error is found, and the error evaluator polynomial need not be computed.

47 Claims, 21 Drawing Sheets

FAST REMAINDER DECODING FOR A REED-SOLOMON CODE

BACKGROUND OF THE INVENTION

This invention relates to information storage and retrieval systems, and more particularly to means for decoding codewords for use in error detection and correction in such systems. Even more particularly, this invention relates to Reed-Solomon codes and related codes, and to improved methods for the decoding of such codes.

In a typical decoder, the coefficients of the syndrome polynomial, called frequency-domain syndromes, are first calculated by dividing the received codeword by each factor of the code generator polynomial. This process is hardware-intensive and/or time-consuming, depending on implementation.

It is possible to efficiently generate the coefficients of the remainder polynomial, called time-domain syndromes, by dividing the received codeword by the entire code generator polynomial. The time-domain syndromes contain the same information as the frequency-domain syndromes.

Methods of decoding using frequency-domain syndromes are known in the prior art, for example see Chapter 3 Practical Error Correction Design for Engineers by Neal Glover and Chapter 5 of Error-Correction Coding for Digital Communications by Clark and Cain. For cases of one error, two frequency-domain syndromes can be used to generate an error location and value, which are then checked with other frequency-domain syndromes using a "Newton's Identities" test. A similar procedure starting with four frequency-domain syndromes may be used to decode cases of two errors. The calculation of frequency-domain syndromes adds significant additional hardware and/or time delay to decoding of cases of one and two errors.

For cases of more than two errors, the frequency-domain syndromes are typically used to iteratively generate an error locator polynomial and an error evaluator polynomial. The error locator polynomial is typically used in a "Chien" search to locate the symbols in error, and the error evaluator polynomial is used to calculate the values of the symbol errors. This process is inefficient when used to locate and evaluate errors in cases of less than five errors.

It is thus apparent that there is a need in the art for improved decoding methods for Reed-Solomon codes and related codes.

SUMMARY OF THE INVENTION

Accordingly, it is an object of the present invention to provide improved decoding methods which decrease the correction time required for cases of one and two errors by decoding directly from time-domain syndromes without generating frequency-domain syndromes.

Another object is to provide improved methods to decrease the correction time required for cases of more than two errors by eliminating the Chien search when the number of yet-to-be-located errors is or has been reduced to four or less.

Another object is to provide improved methods to decrease the correction time required for cases of more than two errors by calculating error values directly from the syndrome polynomial and error locator polynomial without generating the error evaluator polynomial.

Another object is to provide improved methods to decrease the correction time required for cases of more than two errors by reducing the degree of the error locator polynomial and adjusting the syndrome polynomial as each successive error is located.

Another object is to provide improved methods to decrease the correction time required for interleaved codewords of variable lengths by avoiding multiplications by maintaining a parameter for computing pointers to data symbols and remainder coefficients of the first such interleaved codeword and adjusting it as each successive codeword is corrected.

The above and other objects are attained by the present invention which comprises means and methods for fast decoding of Reed-Solomon and related codes. Cases of one and two symbols in error are decoded directly from the read remainder, without computing syndromes. The location of a single symbol in error is quickly determined using the result of a single finite field division as an index into a small precomputed table. Using another larger precomputed table, the value is calculated and the validity of the location and value are confirmed. The larger precomputed table is also used to calculate and validate the locations and values of two symbols in error. Fast decoding of cases of more than two symbols in error is accomplished by employing direct solution of an error locator polynomial to locate errors when four or fewer errors remain to be located and by employing an optimized Chien search to locate errors when more than four errors remain to be located. The invention further simplifies and speeds the decoding of all cases of more than two symbols in error by eliminating the need to compute an error evaluator polynomial and by adjusting the error locator and syndrome polynomials after each error is found.

The above and other objects, features, and advantages of the instant invention will be more apparent from the following more particular description thereof present in conjunction with the accompanying drawings.

DESCRIPTION OF THE PREFERRED EMBODIMENT

Figure 1:
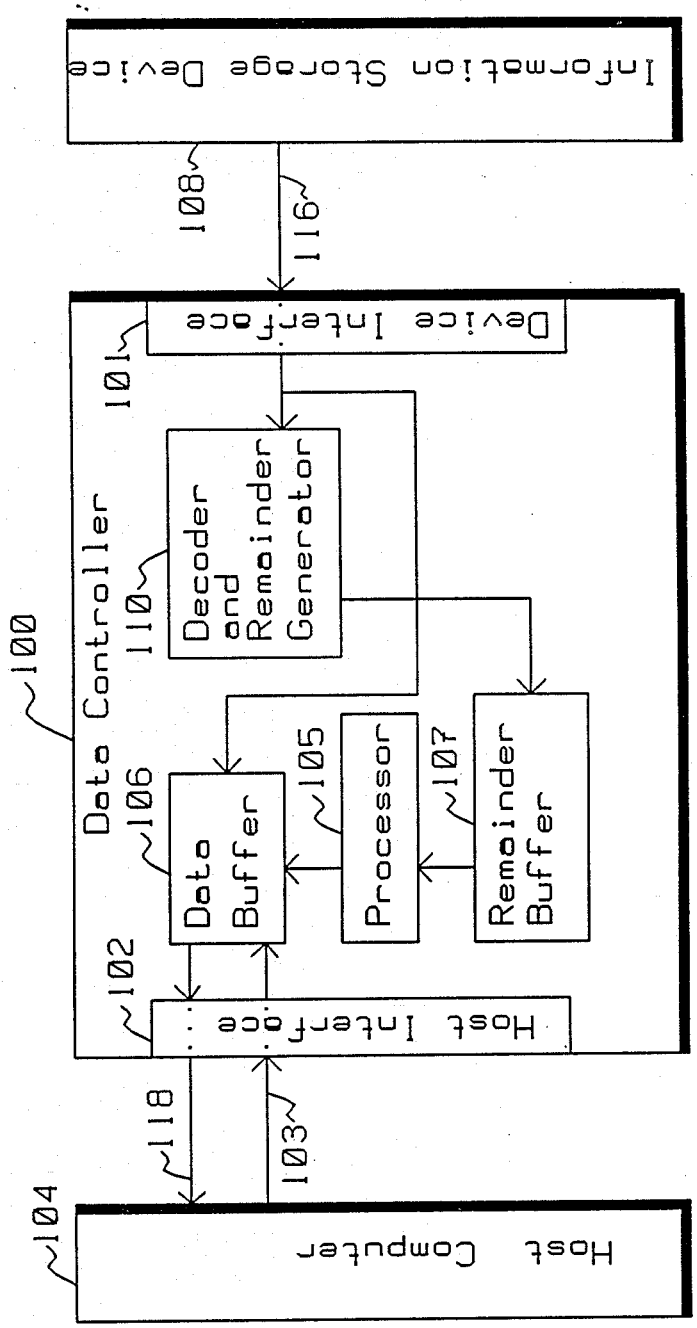
FIG. 1 shows the environment in which the instant invention is used.

The following description is of the best presently contemplated mode of carrying out the instant invention. This description is not to be taken in a limiting sense but is made merely for the purpose of describing the general principles of the invention. The scope of the invention should be determined with reference to the appended claims.

In a finite field GF($2^m$), elements are composed of m binary bits and addition ($\oplus$) consists of MODULO 2 summation of corresponding bits; this is equivalent to performing the bit-wise EXCLUSIVE-OR sum of operands:

$x \oplus y = x\,XOR\,y$.

Note that subtraction is equivalent to addition since the MODULO 2 difference of bits is the same as their MODULO 2 sum.

Multiplication (*) may be implemented using finite field logarithm and antilogarithm tables wherein LOG $[\alpha^i]=i$ and A LOG $[i]=\alpha^i$:

| | |
|---|---|
| $x*y = 0$ | if $x = 0$ or $y = 0$ |
| $x*y = $ ALOG[LOG[$x$] + LOG[$y$]] | if $x \neq 0$ and $y \neq 0$ | where the addition of the finite field logarithms is performed MODULO $2^m-1$. LOG [0] is undefined.

Division (/) may be implemented similarly:

| | |
|---|---|
| $x/y$ is undefined | if $y = 0$ |
| $x/y = 0$ | if $x = 0$ and $y \neq 0$ |
| $x/y = $ ALOG[LOG[$x$] − LOG[$y$]] | if $x \neq 0$ and $y \neq 0$. |

Note that for non-zero x, LOG $[1/x]=-$LOG $[x]=$LOG $[x]$ XOR $2^m-1$.

In a decoder for an error detection and correction system using a Reed-Solomon or related code of distance d for the detection and correction of a plurality of errors in codewords of n symbols comprised of $n-(d-1)$ data symbols and $d-1$ check symbols, each symbol an element of GF($2^m$), a codeword C(x) is given by $$C(x)=(x^{d-1}*I(x))\oplus((x^{d-1}*I(x))\,MOD\,G(x)) \qquad (1)$$

where I(x) is an information polynomial whose coefficients are the $n-(d-1)$ data symbols and G(x) is the code generator polymomial $$G(x) = \prod_{i=0}^{d-2} (x \oplus \alpha^{m_0+i}) \qquad (2)$$

where $m_0$ is a parameter of the code. A code of distance d can be used to correct all cases of $t=$INT$((d-1)/2)$ errors without pointers and is guaranteed to detect all cases of INT(d/2) errors.

When e errors occur, the received codeword C'(x) consists of the EXCLUSIVE-OR sum of a transmitted codeword C(x) and the error polynomial E(x):

$$C'(x)=C(x)\oplus E(x) \qquad (3)$$

where
$$E(x)=E_1*x^{L_1}\oplus \ldots E_e*x^{L_e} \qquad (4)$$

$L_i$ and $E_i$ are the locations and values, respectively, of the e symbol errors.

The remainder $$R(x)=R_{d-2}*x^{d-2}\oplus \ldots \oplus R_1*x\oplus R_0 \qquad (5)$$

is given by $$R(x)=C'(x)\,MOD\,G(x) \qquad (6)$$

that is, the remainder generated by dividing the received codeword C'(x) by the code generator polynomial G(x).

By equation (1), $$C(x)\,MOD\,G(x)=0 \qquad (7)$$

so from equation (3), $$R(x)=E(x)\,MOD\,G(x) \qquad (8)$$

For codes wherein $d \geq 6$, the time required to decode cases of one and two errors may be reduced by decoding directly from the remainder by the use of a large pre-computed table f(i,L). The value of each element of f(i,L) is the coefficient of the $x^i$ term of the remainder generated when $x^L$ is divided by G(x), that is, $$f(d-2,L)*x^{d-2}\oplus \ldots \oplus f(0,L)=x^L\,MOD\,G(x) \qquad (9)$$

Note that f(i,L)$\neq$0 for all i=0 to d−2 and L=d−1 to $2^m-2$.

Hereafter, expressions using elements of f(i,L) are written using the finite field antilogarithmic form of equation (9). Note however, that in the preferred embodiment of this invention the elements of f(i,L) are stored in finite field logarithmic form for computational efficiency. Without loss of generality, discussion is limited to codes wherein $t \geq 3$. To reduce the amount of storage required for the $f(i,L)$ table, the one and two error correction procedure is structured to require only those elements of $f(i,L)$ for $L = d-1$ to $2^m - 2$ and $i = 0$ to T, where $$T = 2t - 1 \text{ for } t = 3,$$

$$T = \text{MAX}(7, t+1) \text{ for } t \geq 4,$$

and only such elements are stored.

From equations (4), (8), and (9), a single error at location L with value E will generate a remainder with coefficients $$R_i = E * f(i,L) \quad (10)$$

when e errors occur in a codeword, the coefficients of the remainder are the EXCLUSIVE-OR sum of the coefficients of the remainders for each error taken separately:

$$R_i = \sum_{j=1}^{e} \circ E_j * f(i, L_j). \quad (11)$$

CASE A

One or two check symbol errors

A.1: One error at location $L < d-1$ with value E. From equation (10), the remainder $R(x)$ has a single non-zero coefficient $$R_L = E.$$

A.2: Two errors at locations $L_1 < d-1$ and $L_2 < d-1$ with values $E_1$ and $E_2$. From equation (11), the remainder $R(x)$ has two non-zero coefficients $$R_{L_1} E_1,$$

$$R_{L_2} = E_2.$$

Cases A.1 and A.2 may be decoded by inspection of the remainder by counting the number of non-zero coefficients $R_i$.

In the preferred embodiment of this invention, non-zero coefficients $R_i$ are counted for $i=0$ to $t+1$. If the total is less or equal to two, we are assured that there are at most $d-t-1$ errors, all at locations $L_i < d-1$, none of which must be corrected since none affects a data symbol. The time required to decode cases of one or more data errors is reduced by counting non-zero coefficients only after a coefficient equal to zero has been detected in the course of decoding Cases B, C, or D.

CASE B

One error at location $L \geq d-1$ with value E. From equation (10), the coefficients of $R(x)$ are given by $$R_i = E * f(i,L).$$

For given a and b, $a \neq b$, the ratio $$\frac{f(b,L)}{f(a,L)}$$

is unique for each value of L such that $d-1 \leq L < 2^m - 1$. This yields a fast method for locating a single error. If either $R_a = 0$ or $R_b = 0$ there must be more than one error; otherwise the ratio $R_b/R_a$ may be used as an index into a pre-computed location table $L_{a,b}$ derived according to $$L_{a,b}\left[\frac{f(b,L)}{f(a,L)}\right] = L,$$

since from equation (10), $$\frac{R_b}{R_a} = \frac{E * f(b,L)}{E * f(a,L)} = \frac{f(b,L)}{f(a,L)}.$$

Location table values corresponding to $L < d-1$ are set to an invalid number, for example zero, to flag the existence of more than one error.

In the preferred embodiment of this invention, the time required to determine the error location is reduced by using LOG $[R_b/R_a]$ as an index into a location table $L_{a,b}$ derived according to $$L_{a,b}\left[\text{LOG}\left[\frac{f(b,L)}{f(a,L)}\right]\right] = L.$$

When the location L is known, the error value E may be trivially computed from equation (10):

$$E = \frac{R_a}{f(a,L)}$$

The computed error location and value may be rapidly validated by gain using equation (10); test $$R_i = E * f(i,L)$$

for values of i not equal to a or b, the indices of the coefficients $R_i$ used to determine the error location and value.

In the preferred embodiment of this invention, $R_0$ and $R_1$ are used to determine L and E, and coefficients $R_i$ are tested for $i = 2$ to t. If all such coefficients are successfully tested, we are assured that there is one error at location $L \leq d-1$ with value E and at most $d-t-2$ errors at locations $t+1 < L_i < d-1$.

CASE C

Two errors, one error at location $L_1 \geq d-1$ with value $E_1$ and a second error at location $L_2 < d-1$ with value $E_2$. From equation (11), the coefficients of $R(x)$ are given by $$R_i = E_1 * f(i,L_1), \text{ for } i \neq L_2;$$

$$R_i = E_1 * f(i,L_1) \oplus E_2, \text{ for } i = L_2. \quad (12)$$

In the preferred implementation of this invention, this case is divided into three subcases:

C.1: $t+1 < L_2 < d-1$

Decoding proceeds as in Case B: error location and value computations using $R_0$ and $R_1$ yield $L_1$ and $E_1$, and coefficients $R_i$ are tested successfully for $i = 2$ to t.

C.2: $2 \leq L_2 \leq t$ Error location and value computations proceed as in Case B, yielding $L_1$ and $E_1$, but the test of $R_{L_2}$ fails. If we perform one additional successful test of $R_{t+1}$, we are assured that there is one error at location $L_1 \leq d-1$ with value $E_1$ and at most $d-t-2$ errors at locations $2 < L_i < d-1$.

C.3: $0 \leq L_2 \leq 1$

If either $R_0$ or $R_1$ is equal to zero, the procedure of Case B detects more than one error. If both $R_0$ and $R_1$ are non-zero, the error location and value computations of Case B yield incorrect results and more than one test of the coefficients $R_i$ fails. In either case we branch to Case D.

If either $R_0$ or $R_1$ is equal to zero and the computations of Case D are restricted to non-zero coefficients, the computation of the denominator of the coefficients of $\sigma(x)$ using $R_{T-3}$ to $R_T$ will produce zero. If both $R_0$ and $R_1$ are non-zero or the computations of Case D are not restricted to non-zero coefficients, the error location computations of Case D using $R_0$ to $R_3$ will correctly locate the two errors, with one having location $0 \leq L_i < 1$. In either case, we may then repeat the single error location and value computations of Case B but using $R_t$ and $R_{t+1}$ in place of $R_0$ and $R_1$, determining L using from a location table $L_{t,t+1}$ derived from $f(t+1,L)/f(t,L)$, and validating the results by testing the coefficients $R_i$ for $i=0$ to $t-1$, allowing one failure at $i=0$ or $i=1$.

Case C.3 occurs with sufficiently low frequency that table storage space may be reduced without signficantly degrading performance by eliminating the $L_{t,t+1}$ table and determining the location of the data symbol error by calculating L as a function of $R_{t+1}/R_t$:

$$L = \text{LOG} \left[ \frac{\alpha^t \oplus \alpha^{t+1} * \frac{G_t'}{G_{t+1}'} * \frac{R_{t+1}}{R_t}}{1 \oplus \frac{G_t'}{G_{t+1}'} * \frac{R_{t+1}}{R_t}} \right] \quad (13)$$

where $G_i'$ is the coefficient of the $x^i$ term of $$G'(x) = \prod_{i=0}^{d-3} (x \oplus \alpha^{m_0+i})$$

In the preferred implementation of this invention, L for Case C.3 is computed from equation (13) using $a=t$ and $b=t+1$. One validation testing failure is allowed for any $i=0$ to $t-1$. If validation testing succeeds, we are assured that there is one error at location $L_1 > d-1$ with the value $E_1$, a second error at location $0 \leq L_2 \leq t-1$, and at most $d-t-3$ errors at locations $t+2 \leq L_i < d-1$.

CASE D

Two errors at locations $L_1 > d-1$ and $L_2 \geq d-1$ with values $E_1$ and $E_2$. From equation (11), the coefficients of the remainder $R(x)$ are given by $$R_i = E_1 * f(i, L_1) \oplus E_2 * f(i, L_2) \quad (14)$$

The coefficients $\sigma_1 = \alpha^{L_1} \oplus \alpha^{L_2}$ and $\sigma_2 = \alpha^{L_1} * \alpha^{L_2}$ of the error locator polynomial $\sigma(x)$ may be computed from four coefficients $R_a$, $R_b$, $R_c$, and $R_d$ according to the equations $$\sigma_1 = \frac{A_{ab}R_aR_b \oplus A_{ac}R_aR_c \oplus A_{ad}R_aR_d \oplus A_{bc}R_bR_c \oplus A_{bd}R_bR_d \oplus A_{cd}R_cR_d}{C_{ab}R_aR_b \oplus C_{ac}R_aR_c \oplus C_{ad}R_aR_d \oplus C_{bc}R_bR_c \oplus C_{bd}R_bR_d \oplus C_{cd}R_cR_d}$$

$$\sigma_2 = \frac{B_{ab}R_aR_b \oplus B_{ac}R_aR_c \oplus B_{ad}R_aR_d \oplus B_{bc}R_bR_c \oplus B_{bd}R_bR_d \oplus B_{cd}R_cR_d}{C_{ab}R_aR_b \oplus C_{ac}R_aR_c \oplus C_{ad}R_aR_d \oplus C_{bc}R_bR_c \oplus C_{bd}R_bR_d \oplus C_{cd}R_cR_d}$$

where the pre-computed constants $A_{ab}$, $B_{ab}$, $C_{ab}$, etc. are functions of a, b, c, and d of the form $$A_{ab} = (\alpha^{2a} \oplus \alpha^{2b}) * (G''_{c-1} * G_d'' \oplus G_c'' * G''_{d-1}),$$

$$B_{ab} = (\alpha^{a} * \alpha^{2b} \oplus \alpha^{b} * \alpha^{2a}) * (G''_{c-1} * G_d'' \oplus G_c'' * G''_{d-1}).$$

$$C_{ab} = (\alpha^{a} \oplus \alpha^{b}) * (G''_{c-1} * G_d'' \oplus G_c'' * G''_{d-1}).$$

and $G_i''$ is the coefficient of the $x^i$ term of $$G''(x) = \prod_{i=0}^{d-4} (x \oplus \alpha^{m_0+i}),$$

with $G_{-1}''$ defined as zero.

In the preferred embodiment of this invention, $R_0$ to $R_3$ are used in computing $\sigma_1$ and $\sigma_2$. For codes wherein $t \geq 4$, the time required to compute $\sigma_1$ and $\sigma_2$ is reduced by choosing four non-zero zero coefficients of $R(x)$: if any of $R_0$ to $R_3$ is equal to zero, $\sigma_1$ and $\sigma_2$ are computed using $R_{T-3}$ to $R_T$. If any of $R_{T-3}$ to $R_T$ is also equal to zero, there exist more than two errors.

We now have the coefficients of the error locator polynomial for the case of two errors $$x^2 \oplus \sigma_1 * x \oplus \sigma_2 = 0.$$

Solution of a quadratic equation in a finite field is known in the prior art; for example, see Chapter 3 of Practical Error Correction Design for Engineers by Neal Glover. Substituting $x = y * \sigma_1$ yields $$y^2 \oplus y \oplus c = 0, \text{ where } c = \frac{\sigma_2}{\sigma_1^2}.$$

For each odd solution to this equation $Y_1$, there is an even solution $Y_2 = Y_1 \oplus 1$. $Y_1$ can be fetched from a pre-computed quadratic table derived according to $$\text{QUAD}[i^2 \oplus i] = i \oplus 1 \text{ for } i = 0, 2, \ldots 2^m - 2$$

using c as an index. There are $2^{m-1}$ such pairs of solutions; the other elements of the table are set to an invalid number, for example zero, to flag the existence of more than two errors. When $Y_1 \neq 0$ and $Y_2 \neq 0$ have been determined, reverse substitution yields expressions for the two error locations $$L_1 = \text{LOG}[\sigma_1 * Y_1]$$

$$L_2 = \text{LOG}[\sigma_1 * Y_2]$$

If both $L_i < d-1$ and neither $L_i$ is not equal to a or b, the indices of the coefficients $R_i$ used in Case B, there must exist more than two errors, otherwise the error situation of Case C.3 may exist.

In the preferred implementation of this invention, Case C.3 is attempted if $L_i < d-1$, whether or not $L_i$ is equal to a or b; Case C.3 will detect cases of more than two errors.

Solving the system of equations $$R_a = E_1 * f(a,L_1) \oplus E_2 * f(a,L_2)$$

$$R_b = E_1 * f(b,L_1) \oplus E_2 * f(b,L_2)$$

yields expressions for the error values $$E_1 = \frac{R_a * f(b,L_2) \oplus R_b * f(a,L_2)}{f(a,L_1)*f(b,L_2) \oplus f(b,L_1)*f(a,L_2)}$$

$$E_2 = \frac{R_a * f(b,L_1) \oplus R_b * f(a,L_1)}{f(a,L_1)*f(b,L_2) \oplus f(b,L_1)*f(a,L_2)}$$

In the preferred embodiment of the invention, $R_0$ and $R_1$ are used in calculating error values if $R_0$ to $R_3$ were used in determining $\sigma(x)$, while $R_{T-3}$ and $R_{T-2}$ are used in calcuating error values if $R_{T-3}$ to $R_T$ were used in determining $\sigma(x)$.

The computed error locations and values may be rapidly validated using equation (11); test $$R_i = E_1 * f(i,L_1) \oplus E_2 * f(i,L_2)$$

for values of i not equal to a, b, c, or d, the indices of the coefficients $R_i$ used to determine the error locations and values.

In the preferred embodiment of this invention, coefficients $R_i$ are tested for i=4 to t+1 if $R_0$ to $R_3$ were used in determining locations and values, and coefficients $R_i$ are tested for i=0 to T-4 if $R_{T-3}$ to $R_T$ were used. If all such coefficients are successfully tested, we are assured that there are two errors at locations $L_1 > d-1$ and $L_2 > d-1$ with values $E_1$ and $E_2$ and at most $d-t-3$ errors at locations $t+2 \leq L_i \leq d-1$.

CASE E

More than two errors, at locations $L_i$ with values $E_i$.

SYNDROME POLYNOMIAL GENERATION: We compute the coefficients $S_i$ of the frequency-domain syndrome polynomial $$S(x) = S_{d-2} * x^{d-2} \oplus \ldots \oplus S_1 * x \oplus S_0$$

from the coefficients $R_i$ of the remainder $R(x)$ according to $$S_i = \sum_{j=0}^{d-2} R_j * \alpha^{j(m_0+i)}.$$

Sequential computation of each coefficient $S_i$ would require d−1 references to each coefficient $R_j$. Physical constraints and interleaving of multiple codewords often make each reference to a coefficient $R_j$ difficult and time-consuming.

In the preferred embodiment of this invention, the time required to calculate the coefficients of S(x) is reduced by the following methods:
(1) Each coefficient $R_j$ is referenced once and its contribution to each coefficient $S_i$ is sequentially computed and added.
(2) A partial result for the contribution of each coefficient $R_j$ to each coefficient $S_i$ is maintained in finite field logarithmic form;
(3) The use of software loops is minimized by using repeated sequential blocks.

(4) The calculation of coefficients $S_i$ required for the decoding of cases of more than four errors is deferred until the iterative error locator polynomial generation routine determines the existence of more than four errors.

ERROR LOCATOR POLYNOMIAL GENERATION: The coefficients of S(x) are used to iteratively generate the coefficients of the error locator polynomial $\sigma(x)$. Such iterative algorithms are known in the prior art; for example, see Chapter 5 of Error-Correction Coding for Digital Communications by Clark and Cain.

In the preferred embodiment of this invention, the time required to evaluate each successive discrepancy value is reduced by using the current degree of $\sigma(x)$ as an index into a table of software jump addresses of appropriate starting points for each evaluation in a sequence of repeated blocks.

ERROR LOCATION AND EVALUATION: If the degree of $\sigma(x)$ indicates more than four errors exist, we evaluate $\sigma(x)$ at $x = \alpha^L$ for each L, $0 \leq L < 2^m - 1$, until the result is zero, which signifies that $\alpha^L$ is a root of $\sigma(x)$ and L is an error location.

In the preferred embodiment of this invention, the time required to evaluate $\sigma(x)$ at each successive location is reduced by maintaining a software address pointer to the appropriate starting point for each evaluation in a sequence of repeated blocks, and by evaluating $\alpha^{jL} * \sigma(x)$ at $x = \alpha^{-L}$ where j is the degree of $\sigma(x)$, rather than evaluating $\sigma(x)$ at $x = \alpha^L$.

When the location L of an error has been determined, $\sigma(x)$ is divided by $(x \oplus \alpha^L)$, producing a new error locator polynomial of degree one less than that of the old:

$$\sigma(x) = \frac{\sigma(x)}{x \oplus \alpha^L}.$$

The error value E may be calculated directly from S(x) and the new $\sigma(x)$ using $$E = \alpha^{-Lm0} * \frac{\sum_{i=0}^{j} \sigma_i * S_{j-i}}{\sigma(x) \quad \alpha^L}$$

where j is the degree of the new $\sigma(x)$.

In the preferred embodiment of this invention, the division of $\sigma(x)$ by $(x \oplus \alpha^L)$ and the calculation of the numerator and denominator of E are all performed in a single software loop.

When the location L and value E of an error have been determined, the coefficients of S(x) are adjusted to remove its contribution according to $$S_i = S_i \oplus E * \alpha^{L(m0+i)}$$

By reducing the degree of $\sigma(x)$ and adjusting S(x) as the location and value of each error are determined, the time required to locate and evaluate each successive error is reduced.

When the degree of j of $\sigma(x)$ is four or less, the time required to locate the remaining errors is reduced by using the special error locating routines below, each of which locates one of the remaining errors without using the Chien search. After the location of an error has been determined by one of the special error locating routines, its value is calculated $\sigma(x)$ is divided by $(x \oplus \alpha^L)$, and S(x) is adjusted in the same way as when an error is located by evaluating $\sigma(x)$.

When j=1, the error locator polynomial is $$x \oplus \sigma_1 = 0$$

By inspection, the root of this equation is $\sigma_1 = \alpha^L$. Thus $$L = \text{LOG}[\sigma_1].$$

When j=2, the error locator polynomial is $$x^2 \oplus \sigma_1 {}^*x \oplus \sigma_2 = 0.$$

One of the roots of this equation may be found using the quadratic method of Case D:

$$L = \text{LOG}\left[\sigma_1 {}^*\text{QUAD}\left[\frac{\sigma_2}{\sigma_1^2}\right]\right].$$

When j=3, the error locator polynomial is $$x^3 \oplus \sigma_1 {}^*x^2 \oplus \sigma_2 {}^*x \oplus \sigma_3 = 0.$$

Solution of a cubic equation in a finite field is known in the prior art; for example, see Flagg, U.S. Pat. No. 4,099,162. Substituting $$x = w \oplus \sigma_1, \quad w = t \oplus B/t, \text{ and } v = t/B^3/B$$

yields a quadratic equation in v:

$$v^2 \oplus v \oplus A^3/B^2 = 0$$

where $$A = \sigma_1^2 \oplus \sigma_2 \text{ and } B = \sigma_1 {}^* \sigma_2 \oplus \sigma_1.$$

A root V of this equation may be found by the quadratic method above. Then by reverse substitution $$L = \text{LOG}\left[\sigma_1 \oplus (B^*V)^{\frac{1}{3}} \oplus \frac{A}{(B^*V)^{\frac{1}{3}}}\right].$$

When j=4, the error locator polynomial is $$x^4 \oplus \sigma_1 {}^*x^3 \oplus \sigma_2 {}^*x^2 \oplus \sigma_3 {}^*x \oplus \sigma_4 = 0.$$

Solution of a quartic equation in a finite field is known in the prior art; for example, see Deodhar, U.S. Pat. No. 4,567,594. If $\sigma_1 = 0$, assign $b_i = \sigma_i$ for i=2 to 4, otherwise substitute $$z = \frac{1}{x \oplus (\sigma_3/\sigma_1)^{\frac{1}{2}}}$$

to give $$z^4 \oplus b_2 z^2 \oplus b_3 z \oplus b_4 = 0$$

where $$b_4 = \frac{\sigma_1^2}{\sigma_1^2 {}^* \sigma_4 \oplus \sigma_1 {}^* \sigma_2 {}^* \sigma_3 \oplus \sigma_3^2},$$

$$b_3 = \sigma_1 {}^* b_4,$$

$$b_2 = ((\sigma_1 {}^* \sigma_3)^{\frac{1}{2}} \oplus \sigma_2) {}^* b_4.$$

The resulting affine polynomial may be solved in the following manner:
(1) Solve for a root Q of the equation $q^3 \oplus b_2 {}^* q \oplus b_3 = 0$ by the cubic method above.
(2) Solve for a root S of the equation $s^2 \oplus b_3/Q {}^* s \oplus b_4 = 0$ by the quadratic method above.
(3) Solve for a root Z of the equation $z^2 \oplus Q {}^* z \oplus S = 0$ by the quadratic method above. If $\sigma_1 = 0$, L=LOG [Z], otherwise reverse substitution yields $$L = \text{LOG}\left[(\sigma_3/\sigma_1)^{\frac{1}{2}} \oplus \frac{1}{Z}\right]$$

Referring to FIG. 1, a data controller 100 having a host interface 102 is connected to a host computer 104. The data controller 100 also has a device interface 101 which connects the data controller 100 to an information storage device 108.

In the process of reading data from information storage device 108, data bits from information storage device 108 are transferred through device information channel 116, through the device interface 101, and into the decoder 110. At the same time the data bits are being transferred into the encoder and time domain syndrome generator 110, they are transferred in parallel into the data buffer 106. As check bits are transferred into the decoder 110, remainder bits are generated by the decoder 110 and transferred to the remainder buffer 107. After the data bits have been transferred into the data buffer 106 and remainder bits transferred to the remainder buffer 107, the processor 105 uses the remainder bits from the remainder buffer 107 to detect and correct, if necessary, errors in the data bits in data buffer 106. After correction of any errors in the data buffer 106, the data bits are transferred through the host interface 102, through the information channel 118 through the host computer 104.

Figure 2:
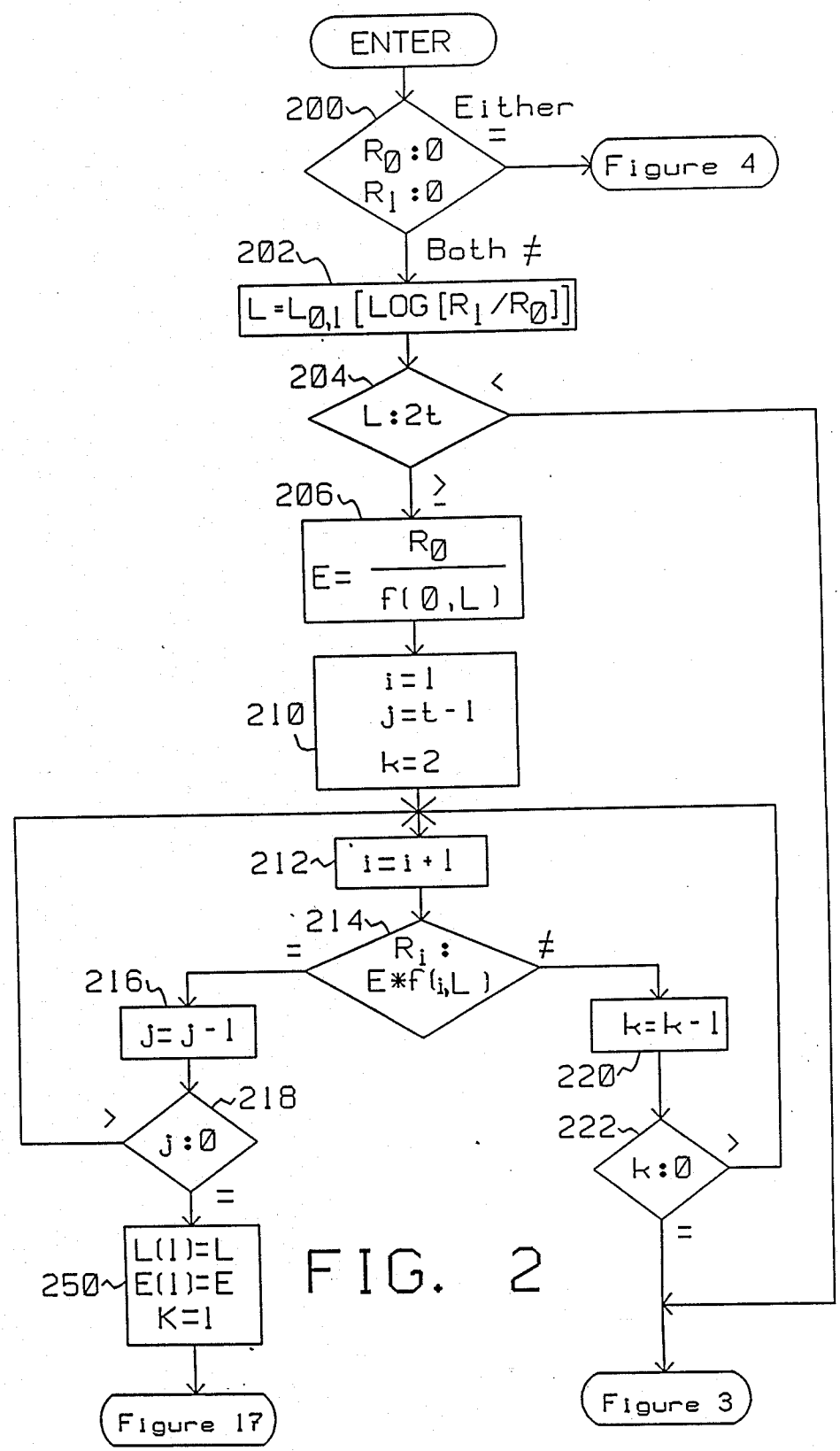
FIG. 2 illustrates the steps required to decode Cases B, C.1, and C.2.
Figure 3:
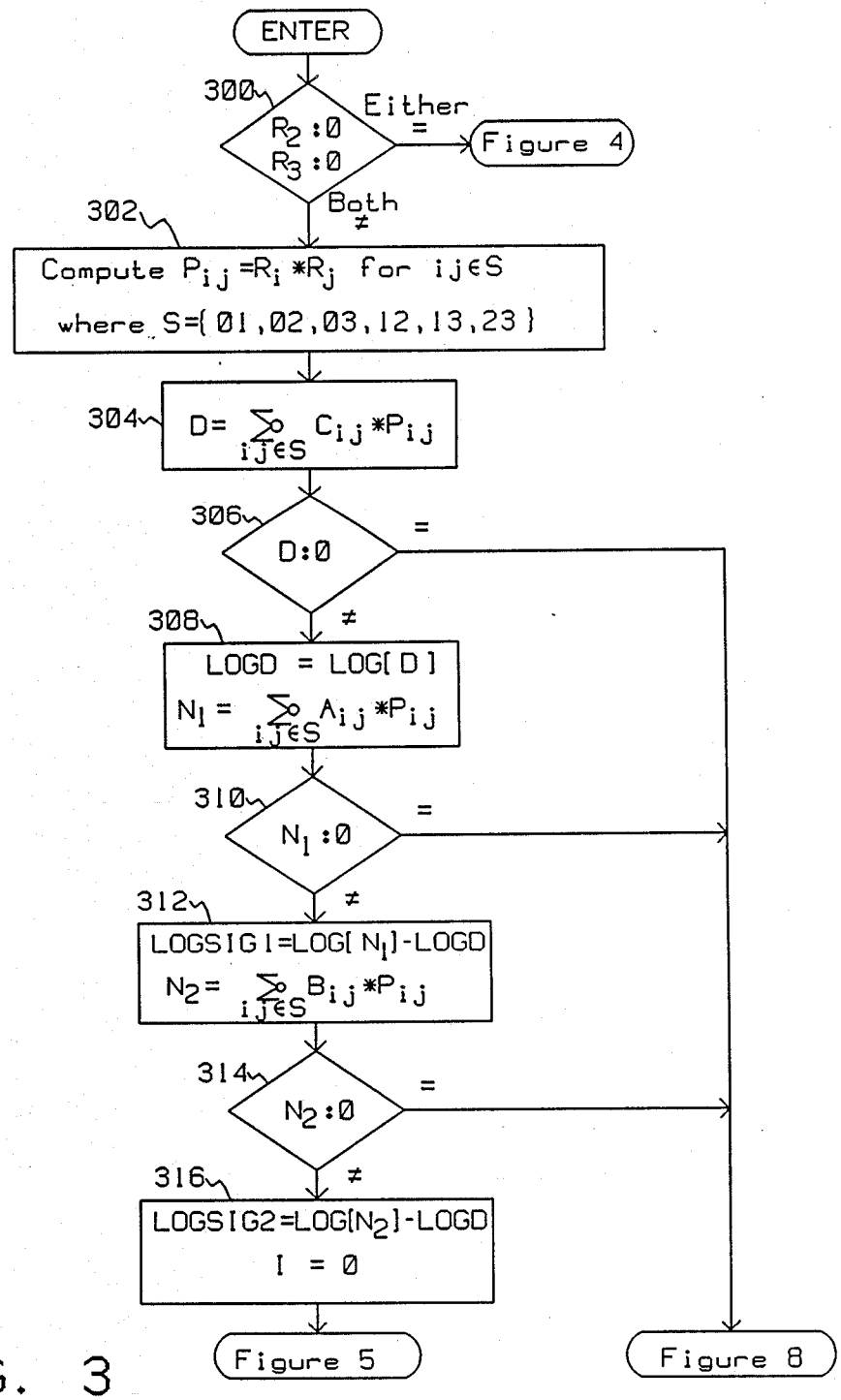
FIG. 3 illustrates the steps required to calculate $\sigma_1$ and $\sigma_2$ for Case D using $R_0$ through $R_3$.
Figure 4:
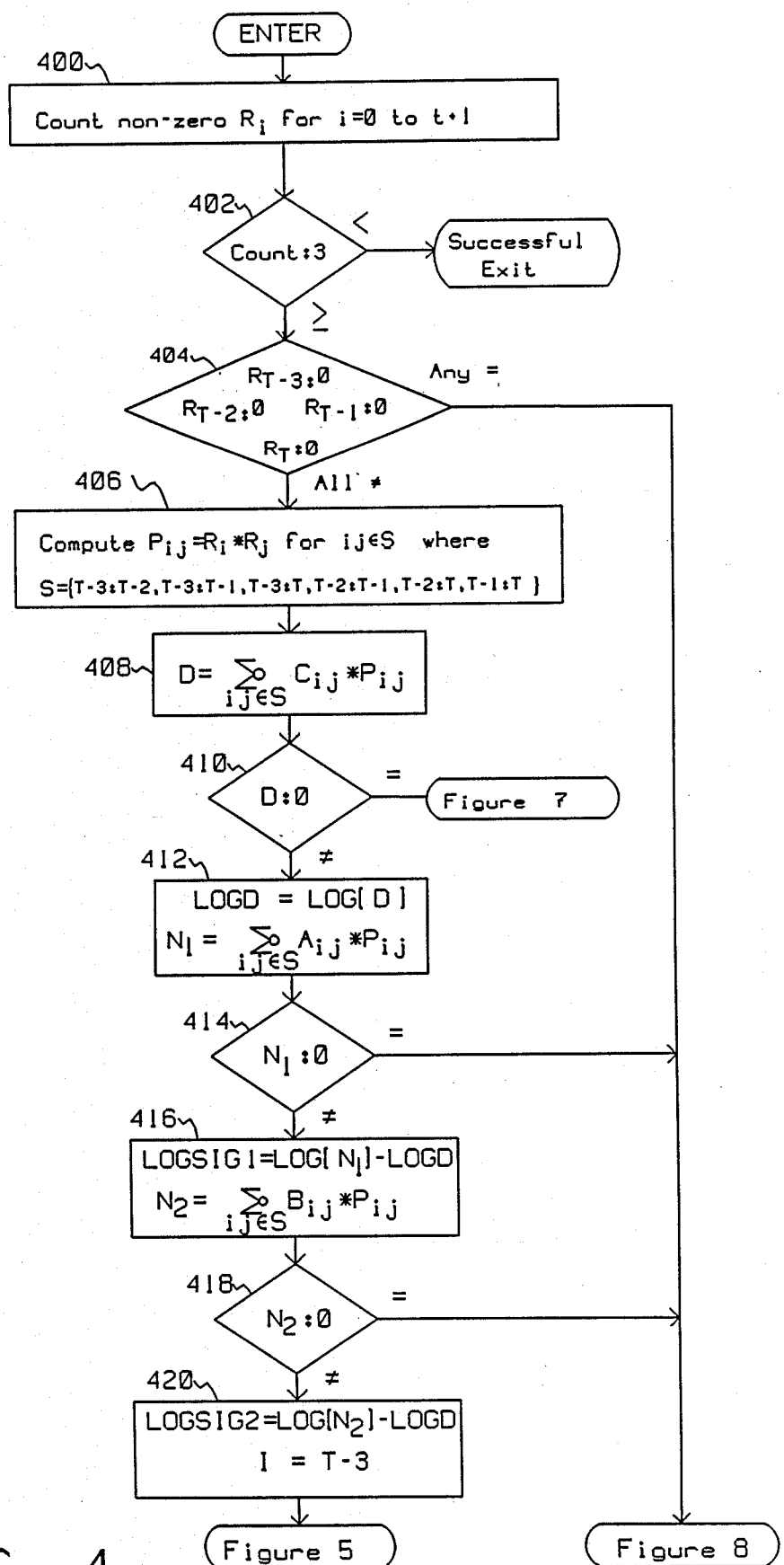
FIG. 4 illustrates the steps required to decode Case A and calculate $\sigma_1$ and $\sigma_2$ for Case D using $R_{T-3}$ to $R_T$.

Referring to FIG. 2, if either $R_0$ or $R_1$ is equal to zero, Step 200 transfers control to FIG. 4, having detected more than one error. Otherwise Step 202 determines the location $L = L_{0,1}[R_1/R_0]$. If L is invalid, that is, less than d−1, Step 204 transfers control to FIG. 3. Otherwise Step 206 calculates the error value $E = R_0/f(O,L)$. Step 210 prepares to validate L and E by initializing counters i=1, j=t−1, and k=2. Step 212 increments counter i. If $R_i \neq E {}^* f(i,L)$, Step 214 transfers control to Step 220. Otherwise Step 216 decrements counter j. If counter j is then still greater than zero, step 218 transfers control back to Step 212 to continue testing coefficients $R_i$. Otherwise L and E have been validated and Step 250 records them before transferring control to FIG. 17 for error correction. After a coefficient $R_i$ fails the test of Step 214, Step 220 decrements counter k. If counter k is then still greater than zero, Step 222 transfers control back to Step 212 to continue testing coefficients $R_i$. Otherwise L and E are invalid and control is transferred to FIG. 3.

Figure 2A:
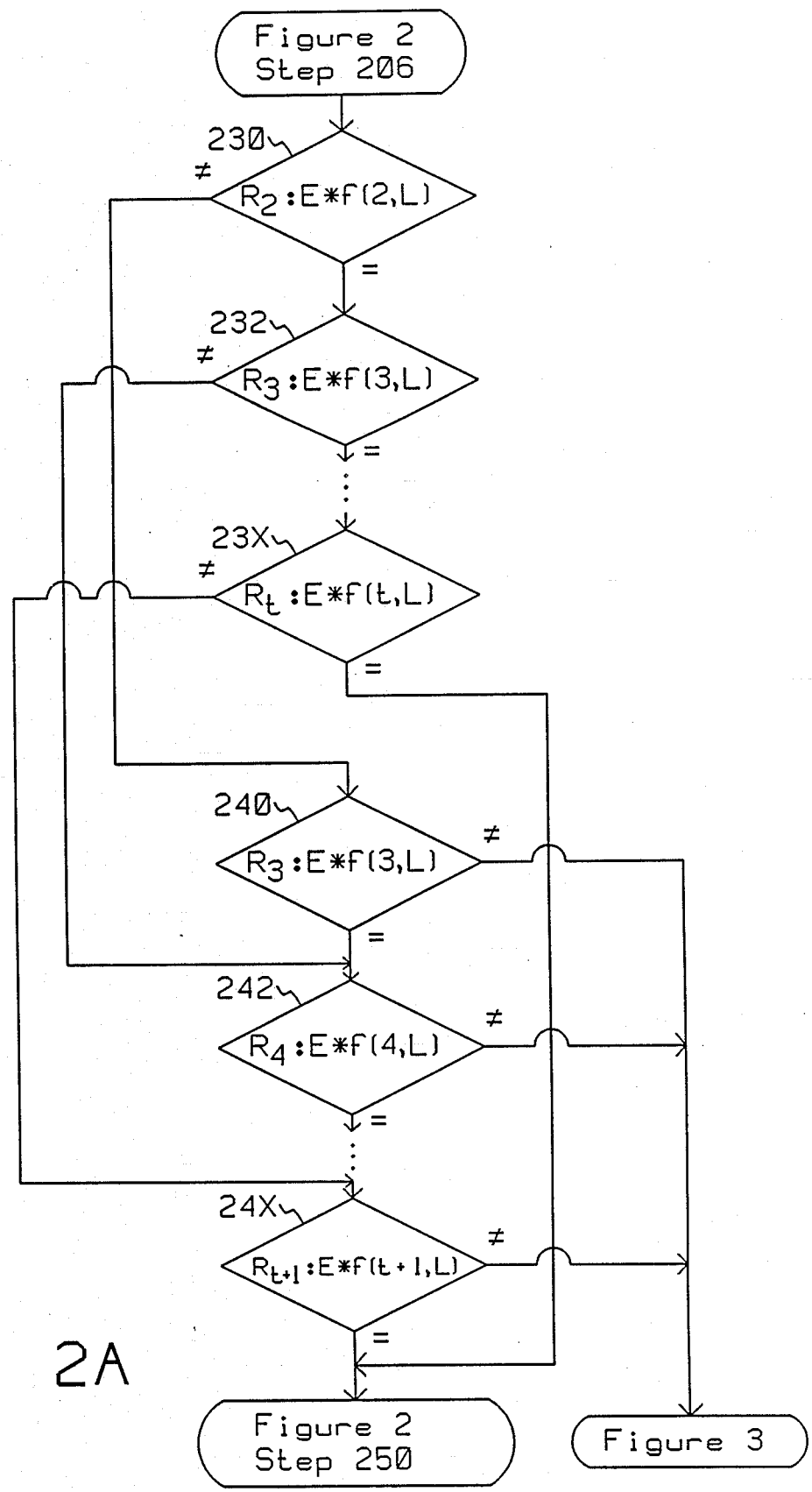
FIG. 2A illustrates the steps required to validate the error location and value for Cases B, C.1, and C.2 using sequential repeated blocks.

The time required for executing looping control and maintaining counters in FIG. 2 may be eliminated by replacing Steps 210 to 222 of FIG. 2 with the repeated sequential blocks of FIG. 2A. Steps 230 through 23x sequentially test coefficients $R_i$ for i=2 to t. If all of these tests succeed, L and E have been validated and Step 23x transfers control to Step 250 of FIG. 2. Otherwise control is transferred into Steps 240 to 24x, where sequential testing of coefficients $R_i$ continues through i=t+1. If all of the remaining tests in this second set succeed, L and E have been validated and Step 24x transfers control to Step 250 of FIG. 2. If any of the tests of Steps 240 to 24x fails, L and E are invalid and control is transferred to FIG. 3.

Referring to FIG. 3, on entry both $R_0$ and $R_1$ are known to be non-zero. If $t \geq 4$ and either $R_2$ or $R_3$ is equal to zero, Step 300 transfers control to FIG. 4 to attempt calculation of $\sigma_1$ and $\sigma_2$ using $R_{T-3}$ through $R_T$. Otherwise Step 302 calculates the products of $R_0$ to $R_3$ taken two at a time. Step 304 computes the denominator of $\sigma_1$ and $\sigma_2$. If the denominator is equal to zero, Step 306 transfers control to FIG. 8. Otherwise Step 308 computes the log of the denominator, and the numerator of $\sigma_1$. If the numerator of $\sigma_1$ is equal to zero, Step 310 transfers control to FIG. 8. Otherwise Step 312 computes the log of $\sigma_1$, and the numerator of $\sigma_2$. If the numerator of $\sigma_2$ is equal to zero, Step 314 transfers control to FIG. 8. Otherwise Step 316 calculates the log of $\sigma_2$ and sets counter I=0 to signify that $R_0$ to $R_3$ were used in computing $\sigma_1$ and $\sigma_2$, then transfers control to FIG. 5.

Referring to FIG. 4, on entry at least one of $R_0$ to $R_3$ is known to be equal to zero. Step 400 counts the number of non-zero coefficients $R_i$ for i=0 to t+1. If the result is less than three, there are no data symbols in error; Step 402 exits the correction procedure successfully without correcting any data symbols, having decoded Case A. Otherwise if any of $R_{T-3}$ to $R_T$ are equal to zero, Step 404 transfers control to FIG. 8, having detected more than two errors. Otherwise Step 406 calculates the products of $R_{T-3}$ to $R_T$ taken two at a time. Step 408 computes the denominator of $\sigma_1$ and $\sigma_2$. If the denominator is equal to zero, Step 410 transfers control to FIG. 7, having possibly detected Case C.3. Otherwise Step 412 computes the log of the demoninator, and the numerator $\sigma_1$. If the numerator of $\sigma_1$ is equal to zero, Step 414 transfers control to FIG. 8. Otherwise Step 416 computes the log of $\sigma_1$, and the numerator of $\sigma_2$. If the numerator of $\sigma_2$ is equal to zero, Step 418 transfers control to FIG. 8. Otherwiste STep 420 calculates the log of $\sigma_2$ and sets counter $I=T-3$ to signify that $R_{T-3}$ to $R_T$ were used in computing $\sigma_1$ and $\sigma_2$, then transfers control to FIG. 5.

Figure 5:
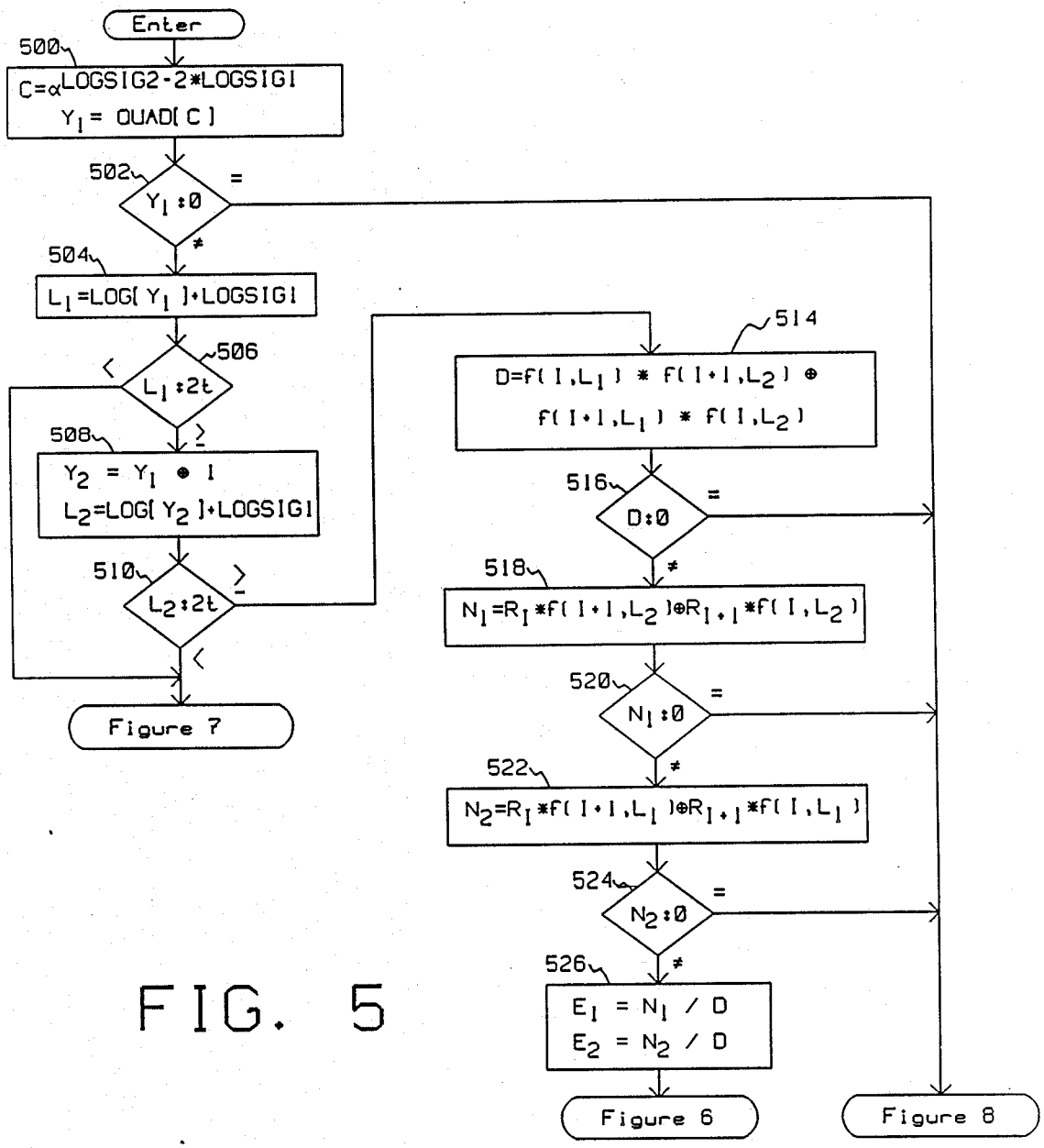
FIG. 5 illustrates the steps required to calculate the error locations and values for Case D.

In FIG. 5, which computes the error locations and values for Case D, Step 500 calculates the quantity $c=\sigma_2/(\sigma_1)^2$ and fetches $Y_1=QUAD[c]$; $Y_1$ is known to be not equal to one, since $\sigma_2$ is known to be non-zero. If $Y_1$ is equal to zero, Step 502 transfers control to FIG. 8. Otherwise Step 504 calculates locations $L_1$. If $L_1$ is less than d−1, Step 506 transfers control to FIG. 7, having possibly detected Case C.3. Otherwise Step 508 calculates $Y_2$ and location $L_2$; $Y_2$ is known to be not equal to zero since $Y_1$ is not equal to one. If $L_2$ is less than d−1, Step 510 transfers control to FIG. 7, having possibly detected Case C.3. Otherwise Step 514 computes the denominator of error values $E_1$ and $E_2$. If the denominator is equal to zero, Step 516 transfers control to FIG. 8. Otherwise Step 518 calculates the numerator of $E_1$. If the numerator of $E_1$ is equal to zero, Step 520 transfers control to FIG. 8. Otherwise Step 522 calculates the numerator of $E_2$. If the numerator of $E_2$ is equal to zero, Step 524 transfers control to FIG. 8. Otherwise Step 526 calculates $E_1$ and $E_2$, then transfers control to FIG. 6.

Figure 6:
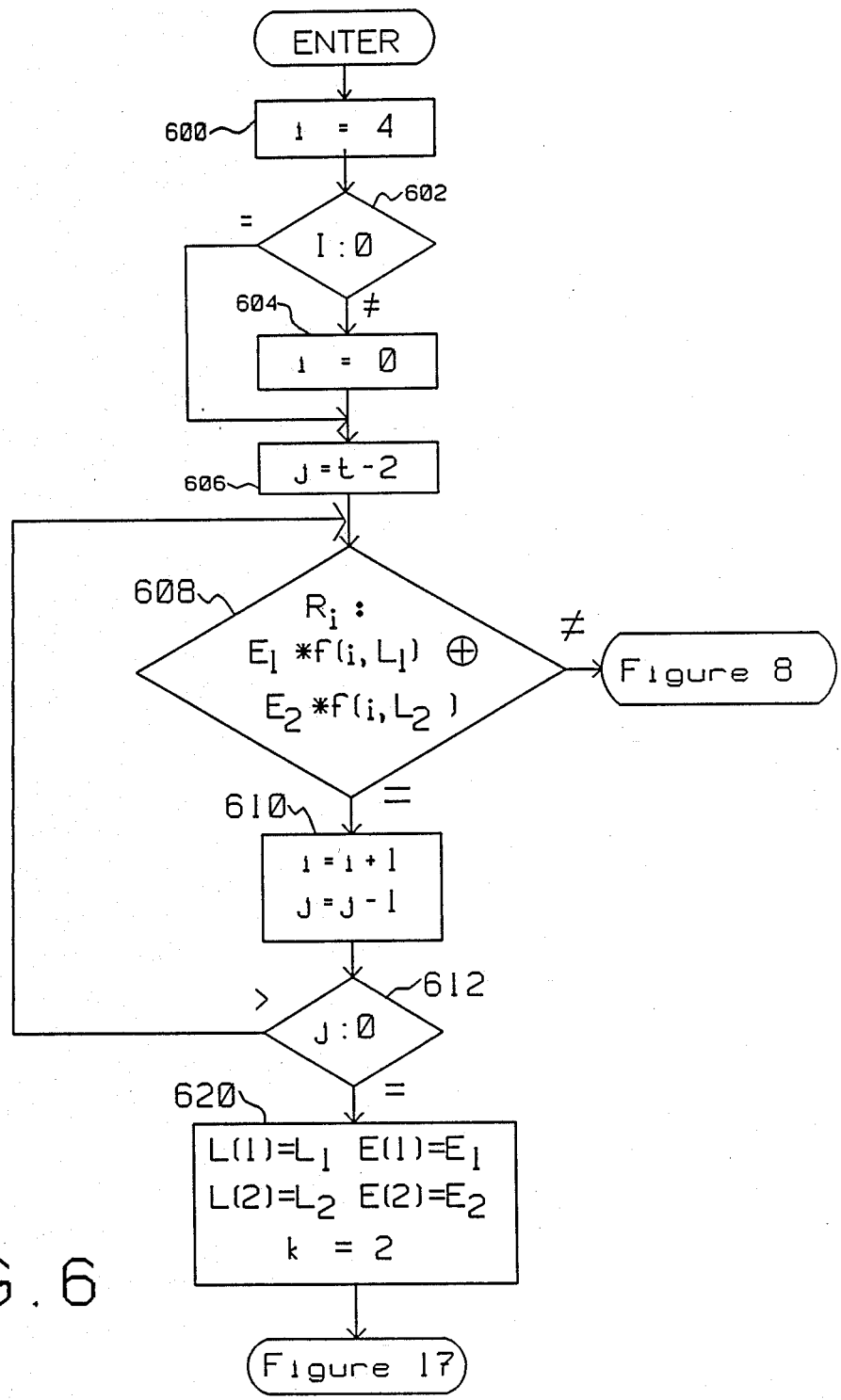
FIG. 6 illustrates the steps required to validate the error locations and values for Case D.

Referring to FIG. 6, Step 600 initializes counter i=4. If counter I is equal to zero, Step 602 transfers control to Step 606. Otherwise Step 604 initializes counter i=0. Step 606 initializes counter j=t−2. If $R_i \neq E_1 * f(i, L_1) \oplus E_2 * f(i, L_2)$, the computed error locations and values are invalid and Step 608 transfers control to FIG. 8. Otherwise Step 610 increments counter i and decrements counter j. If counter j is then still greater than zero, step 612 transfers control back to Step 608. Otherwise the error locations and values have been validated and Step 620 records them and transfers control to FIG. 17 for error correction.

Figure 6A:
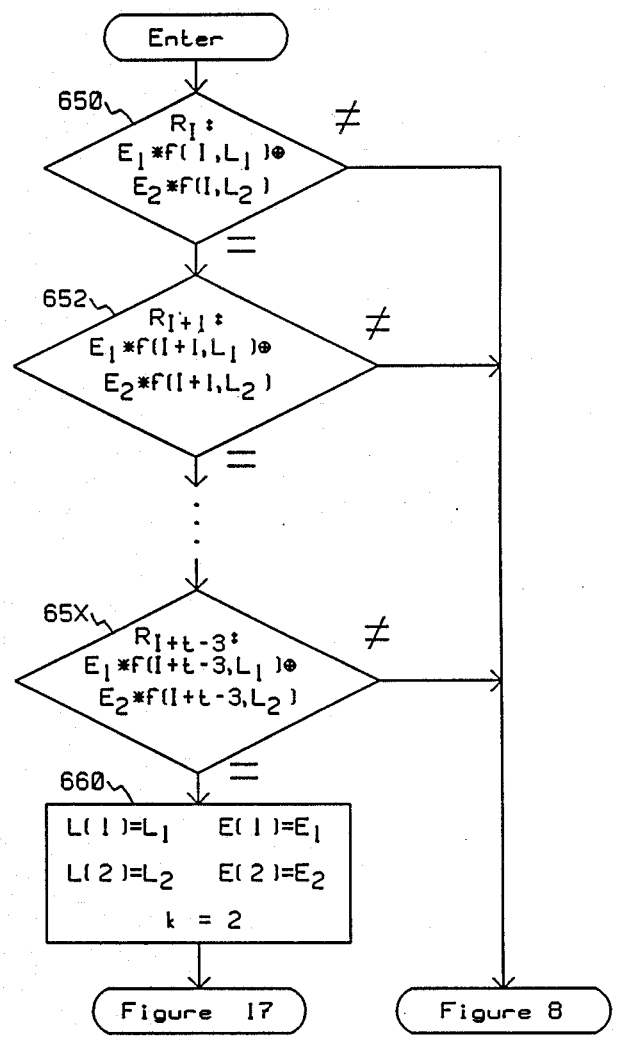
FIG. 6A illustrates the steps required to validate the error locations and values for Case D using sequential repeated blocks.

The time required for executing looping control and maintaining counters in FIG. 6 may be eliminated by replacing FIG. 6 with the repeated sequential blocks of FIG. 6A. Steps 650 through 65x sequentially test coefficients $R_i$ for i=I to I+t−3. If any of these tests fails, the locations and values are invalid and control is transferred to FIG. 8. Otherwise the locations and values bave been validated and Step 660 records them and transfers control to FIG. 17 for error correction.

Figure 7:
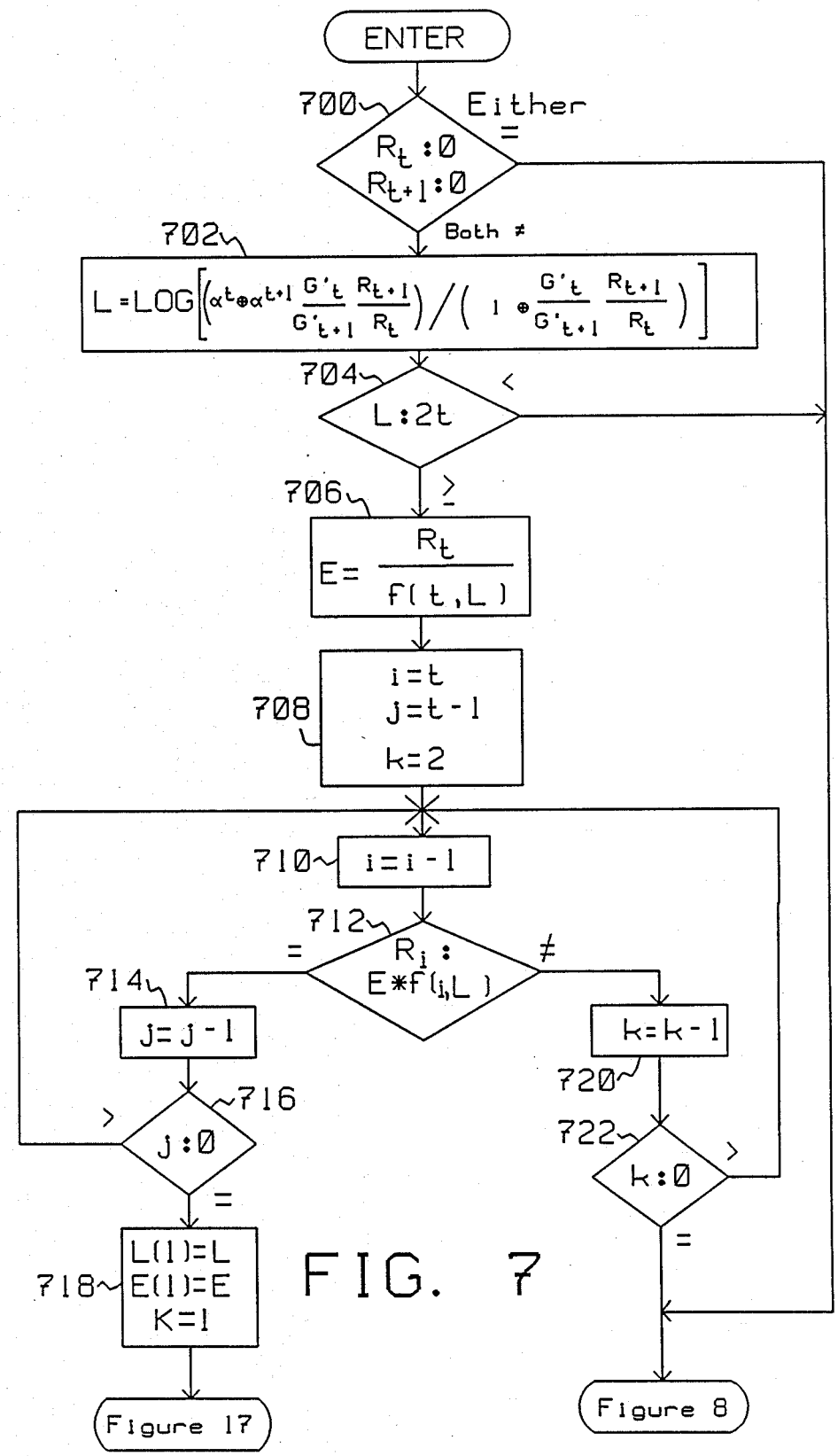
FIG. 7 illustrates the steps required to decode Case C.3.
Figure 8:
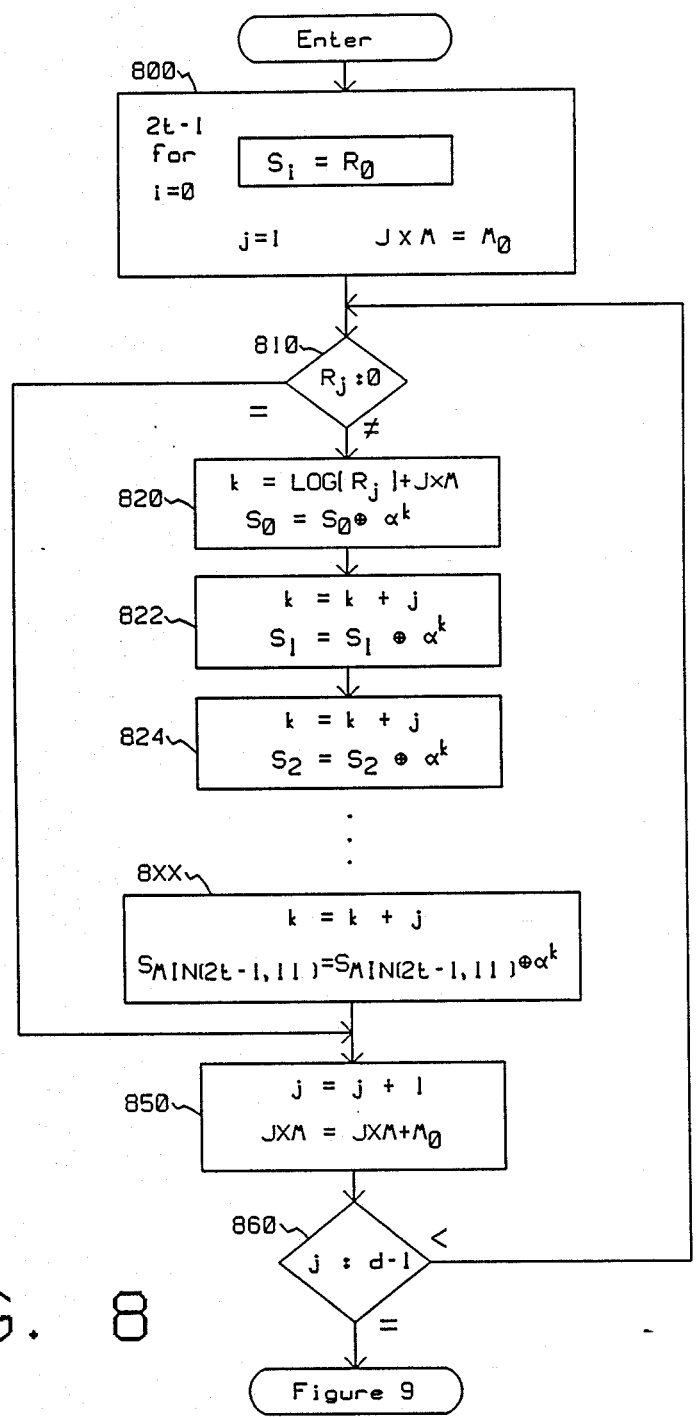
FIG. 8 illustrates the steps required to calculate the coefficients of $S(x)$ required to decode cases of three and four errors for Case E.

Referring to FIG. 7, if either $R_t$ or $R_{t+1}$ is equal to zero, Step 700 transfers control to FIG. 8. Otherwise Step 702 calculates the location L from equation (13). If L is invalid, Step 704 transfers control to FIG. 8. Otherwise Step 706 calculates the error value $E=R_t/f(t, L)$ and prepares to validate L and E by initializing counters i=t, j=t−1, and k=2. Step 710 decrements counter i. If $R_1 \neq E * f(i, L)$, Step 712 transfers control to Step 720. Otherwise Step 714 decrements counter j. If counter j is then still greater than zero, step 716 transfers control back to Step 710. Otherwise L and E have been validated and Step 718 records them and transfers control to FIG. 17 for error correction. When a coefficient $R_i$ fails the test of Step 712, Step 720 decrements counter k. If counter k is then still greater than zero, Step 722 transfers control back to Step 710. Otherwise L and E are invalid and control is transferred to FIG. 8.

Referring to FIG. 8, Step 800 initializes all $S_i=R_0$ and initializes counters j=1 and $JXM=m_0$. The purpose of counter JXM is to maintain the quantity $j*m_0$ for successive values of j by repaeated additions of $m_0$ and not by multiplication. If $R_j=0$, Step 810 transfers control to Step 850 since $R_j$ does not alter the coefficients $S_i$. Otherwise Step 820 computes $k = LOG [R_j] + JXM$ and adds $\alpha^k$ to $S_0$. Step 822 computes $k=k+j$ and adds $\alpha^k$ to $S_1$. Steps 824 to 8xx repeat the operations of Step 822 to compute and add the contribution of $R_j$ to $S_i$ for i=2 to MIN(2t−1,11). Step 850 increments counter j and computes $JXM=JXM+m_0$. If counter j is then still less than d−1, Step 860 transfers control back to Step 810. Otherwise the coefficients $S_i$ for i=0 to MIN(2t−1,11) have been calculated and control is transferred to FIG. 9.

Figure 9:
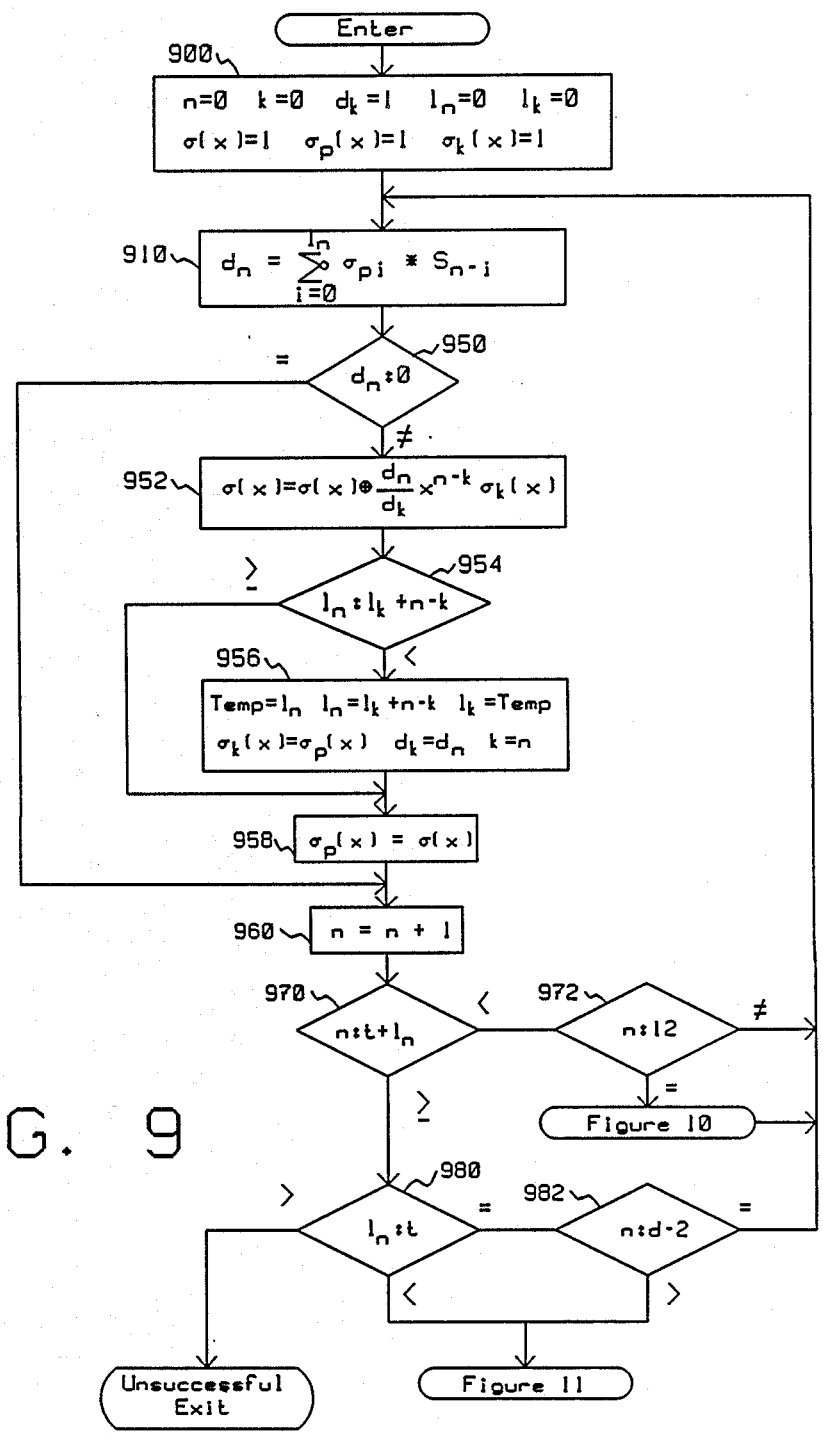
FIG. 9 illustrates the steps required to iteratively generate the error locator polynomial for Case E.

Referring to FIG. 9, Step 900 initializes the polynomials, parameters, and counters. Step 910 computes the nth discrepancy value $d_n$. If $d_n$ is equal to zero, Step 950 transfers control to Step 960. Otherwise Step 952 updates $\sigma(x)$. If $1_n \geq 1_k+n-k$, Step 954 transfers control to Step 958. Otherwise Step 956 updates $\sigma_k(x)$ and other parameters. Step 958 updates $\sigma_p(x)$. Step 960 increments counter n. If $n < t+1_n$, Step 970 transfers control to Step 972. If $n \neq 12$, Step 972 transfers control back to Step 910 to perform another iteration; otherwise FIG. 10 computes the remaining coefficients $S_i$ before transferring control back to Step 910. Otherwise if $1_n$, the degree of $\sigma(x)$, is greater than t, the number of errors the code can correct, Step 980 exits the correction procedure unsuccessfully. If $1_n=t$, Step 980 transfers control to Step 982; if n=d−2, one additional iteration is required before terminating the algorithm so Step 982 transfers control back to Step 910. Otherwise we are assured that we have generated a valid error locator polynomial and control is transferred to FIG. 11.

Figure 9A:
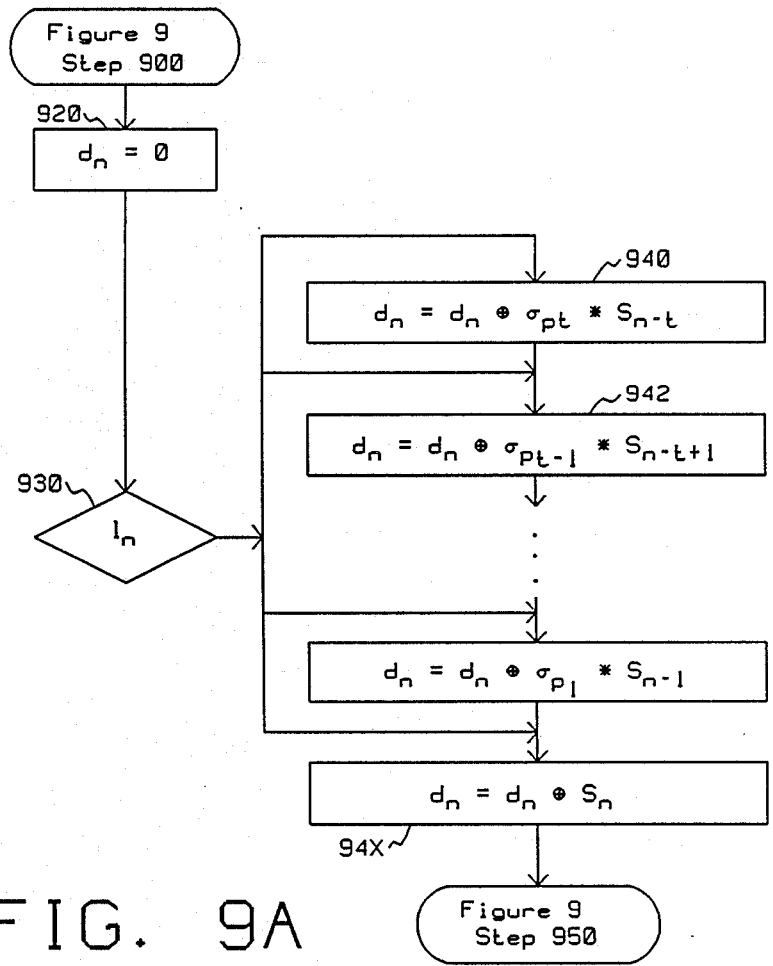
FIG. 9A illustrates the steps required to calculate the nth discrepancy $d_n$ using sequential repeated blocks.

The evaluation of the nth discrepancy $d_n$ of step 920 may be implemented with repeated sequential blocks as in FIG. 9A. Step 920 initializes $d_n=0$. Step 930 uses $1_n$ as an index into a table of software jump addresses to transfer control to the appoprate starting point in Steps 940 to 94x for the evaluation of $d_n$. Multiplying $S_n$ by $\sigma_{p0}$ is not required in Step 94x since $\sigma_{p0}$ is always equal to one. When $d_n$ has been computed, control is transferred to Step 950 of FIG. 9.

Figure 10:
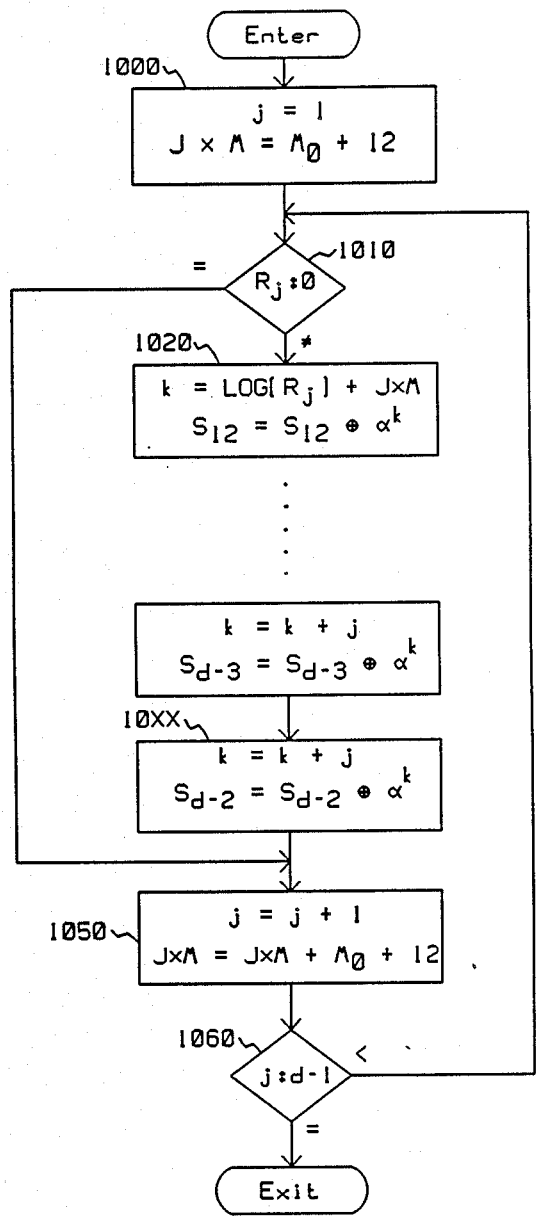
FIG. 10 illustrates the steps required to calculate the additional coefficients of S(x) required to decode cases of more than four errors for Case E.

Referring to FIG. 10, operation is similar to that of FIG. 8. After the remaining coefficients of $S(x)$ have been calculated, control is transferred back to Step 910 of FIG. 9.

Figure 11:
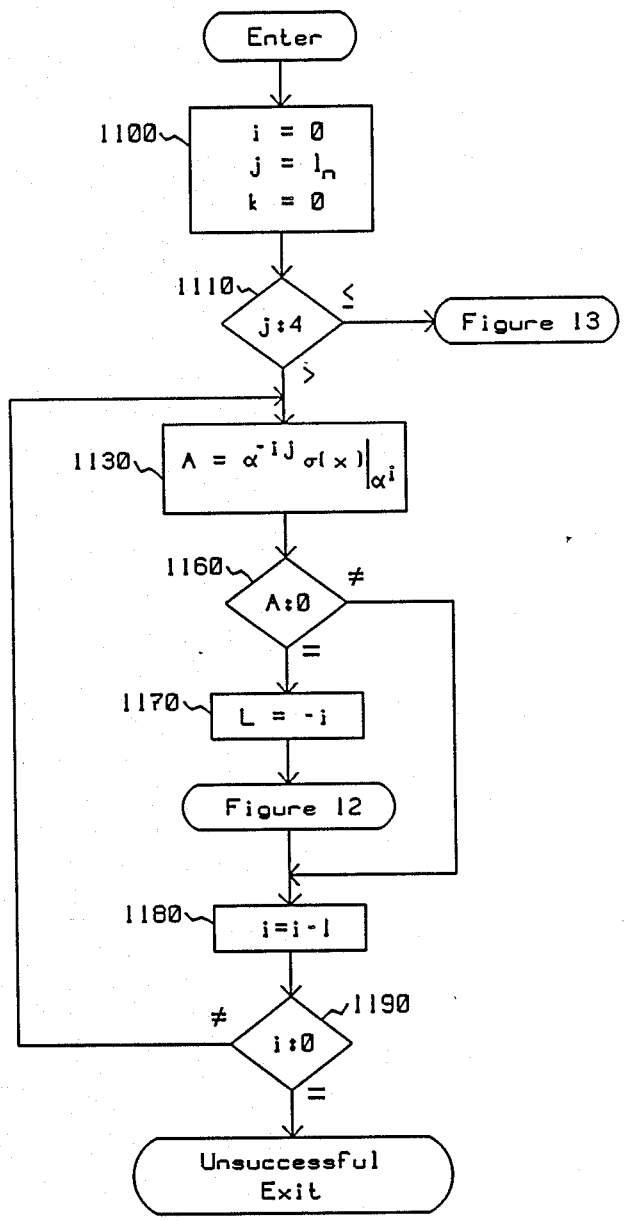
FIG. 11 illustrates the steps required to locate and evaluate errors by searching for roots of $\sigma(x)$ for Case E.

Referring to FIG. 11, Step 1100 initializes counters $i=0$, $j=1_n=$the degree of $\sigma(x)$, and $k=0=$the number of error locations which have been found. If j is less than five, Step 1110 transfers control to FIG. 13. Otherwise Step 1130 evaluates $\alpha-ji*\sigma(x)$ at $x=\alpha^i$. If the result A is equal to zero, a root of $\sigma(x)$ has been found and Step 1160 transfers control to Step 1170, which forms $L=-i$ before transferring control to FIG. 12. Otherwise Step 1180 decrements counter i in the finite field. If counter i is then not equal to zero, Step 1190 transfers control back to Step 1130 to evaluate $\sigma(x)$ at the next location. Otherwise all possible locations have been tested without locating all the errors; therefore the correction correction procedure is exited unsuccessfully.

Figure 11A:
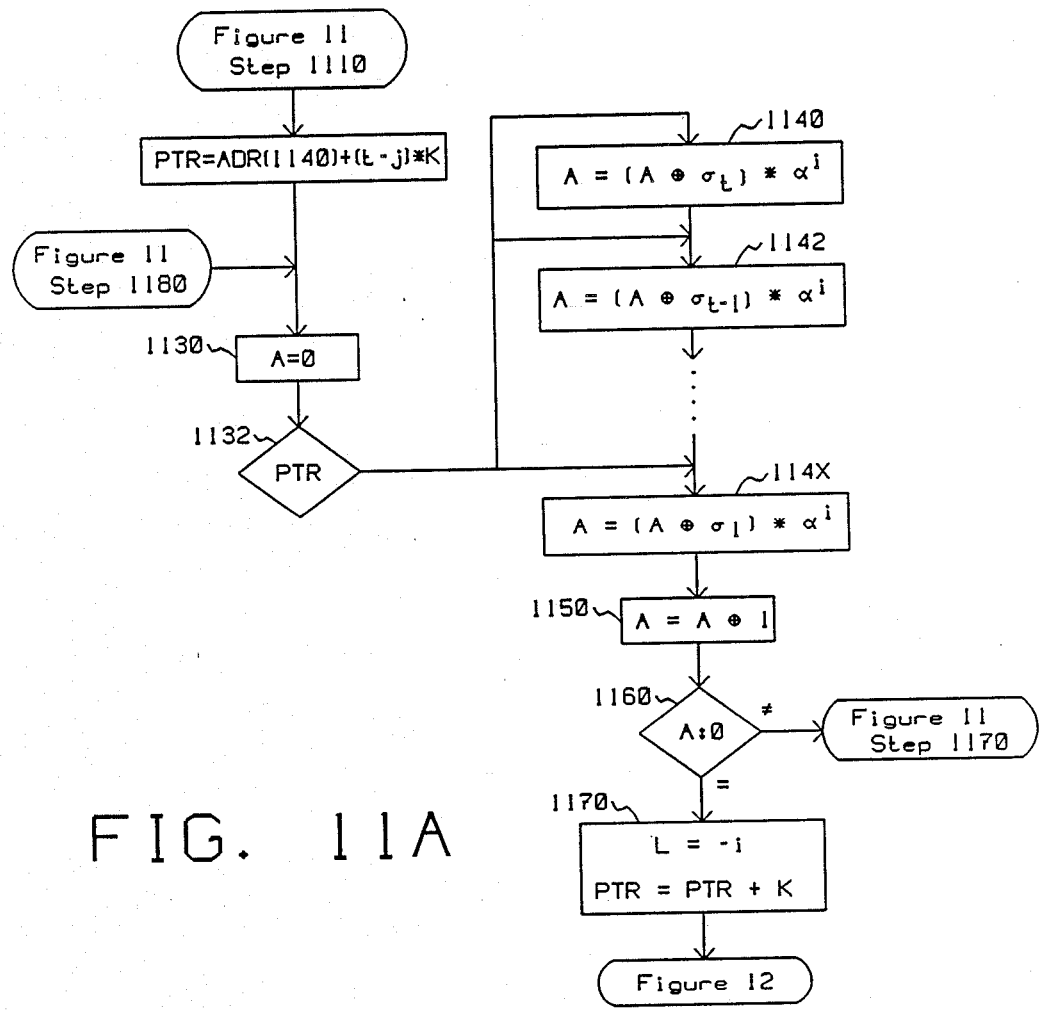
FIG. 11A illustrates the modifications to FIG. 11 required to evaluate $\alpha^{-ji}*\sigma(x)$ at $x=\alpha^i$ using sequential repeated blocks.

FIG. 11A shows modifications to FIG. 11 necessary for efficient evaluation of $\alpha-ji*\sigma(x)$ using repeated sequential blocks. Step 1120 is added to use counter j to compute an initial software jump address PTR=ADR(- Step 1140)$+(t-j)*K$ where K is the size of each Step 1140 through 114x. Step 1130 initializes $A=0$, then Step 1132 uses PTR to transfer control into Steps 1140 to 114x, which sequentially evaluate $\alpha-ji*\sigma(x)$ at $x=\alpha^i$ using Horner's rule. Step 1170 is modified to update PTR=PTR+K to reflect the decrementing of j performed in FIG. 12.

Figure 12:
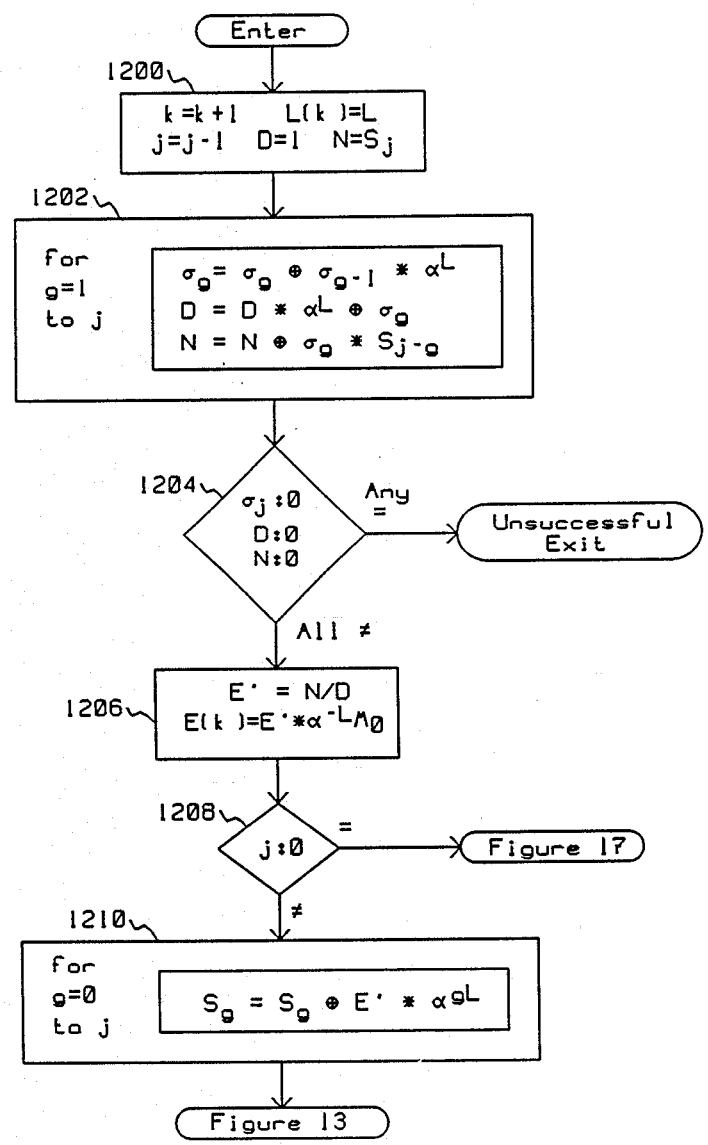
FIG. 12 illustrates the steps required to divide $\sigma(x)$ by $(x \oplus \alpha^L)$, compute the error value E, and adjust the coefficients of S(x) for Case E.

Referring to FIG. 12, Step 1200 increments counter k, records L, decrements counter j, then initializes $D=1$ and $N=S_j$. Step 1202 divides $\sigma(x)$ by $(x\oplus\alpha^L)$ and calculates the numerator and denominator of $E'=E*\alpha^{L*m}0$. If the new $\sigma_j$ is equal to zero, the new $\sigma(x)$ has a root equal to zero, which is not the finite field antilogarithm of any error location; Step 1204 exits the correction procedure unsuccessfully. If the numerator is equal to zero, the computed error value is equal to zero, which is not a valid error value, so Step 1204 exits the correction procedure unsuccessfully. If the denominator is equal to zero, the error value cannot be computed, since division by zero in a finite field is undefined; Step 1204 exits the correction procedure unsuccessfully. If $\sigma_j$, the numerator, and the denominator are each not eaqual to zero, Step 1204 transfers control to Step 1206, which calculates and records $E=\alpha^{-Lm}0*N/D$. If counter j is equal to zero, Step 1208 transfers control to FIG. 17 for error correction. Otherwise Step 1210 adjusts the coefficients of $S(x)$ to remove the effects of the error just found and transfers control to FIG. 13.

Figure 13:
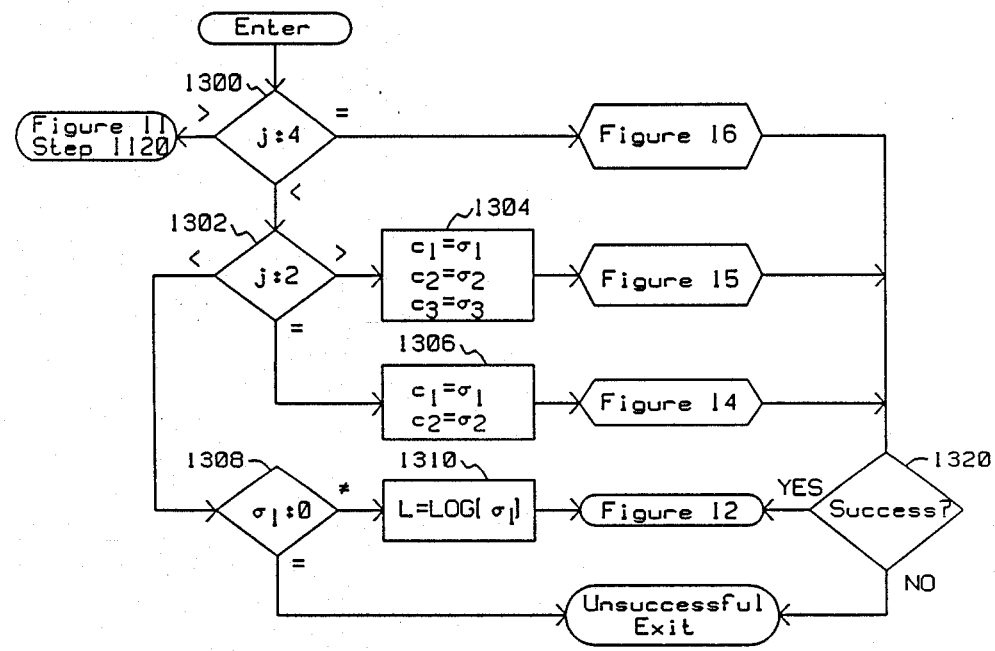
FIG. 13 illustrates the steps required to transfer control to the appropriate special error location subroutine for Case E.

Referring to FIG. 13, if more than four errors remain, Step 1300 transfers control to Step 1180 of FIG. 11 to search for another error location by evaluating $\sigma(x)$. If four errors remain, Step 1300 calls the quartic solution subroutine of FIG. 16. If three errors remain, Step 1302 transfers control to Step 1304, which sets parameters for and calls the cubic solution subroutine of FIG. 15. If two errors remain, Step 1302 transfers control to Step 1306, which sets parameters for and calls the quadratic solution subroutine of FIG. 14. Otherwise one error remains and Step 1302 transfers control to Step 1308.

If $\sigma_1$ is equal to zero, Step 1308 exits the correction procedure unsuccessfully, since the finite field logarithm of zero is undefined. Otherwise Step 1310 determines $L=LOG[\sigma_1]$ and transfers control to FIG. 12.

Likewise, if one of the subroutines successfully determines an error location, Step 1320 transfers control to FIG. 12. Otherwise, the correction procedure is exited unsuccessfully.

Figure 14:
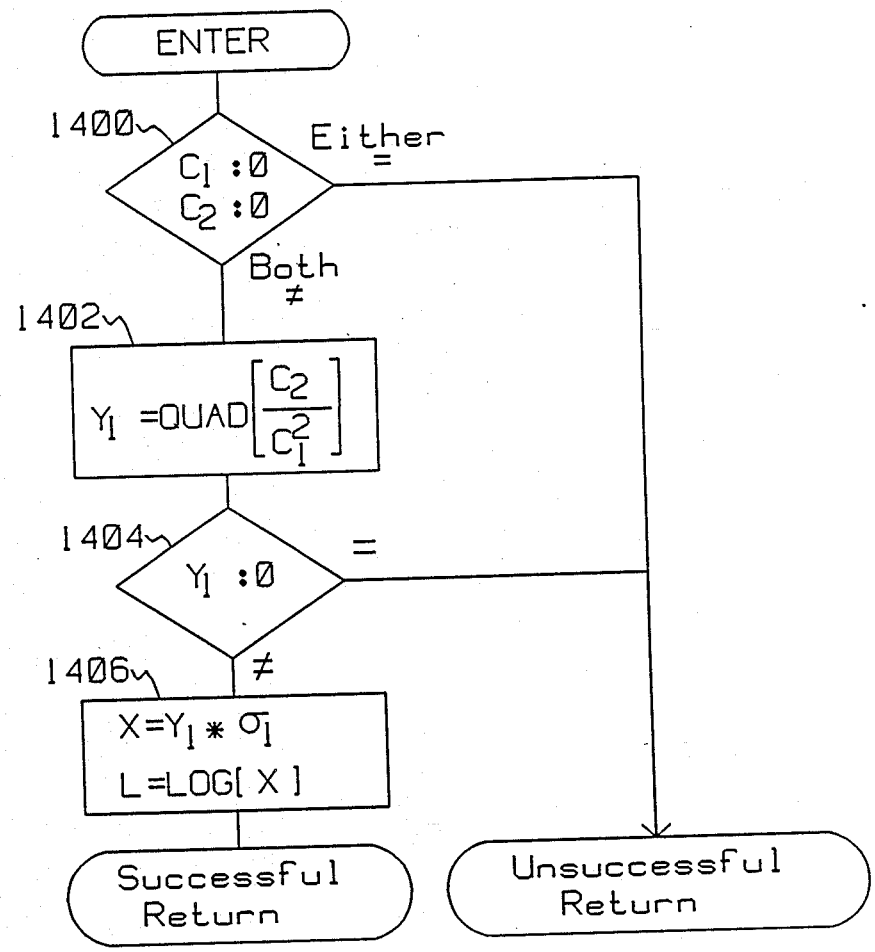
FIG. 14 illustrates the steps required to solve for a root X, and its log L, of a quadratic equation in a finite field.

On entry to FIG. 14, the parameters $c_1$ and $c_2$ describe the quadratic equation $$x^2 \oplus c_1*x \oplus c_2 = 0.$$

If $c_1=0$, the equation has a repeated root. If $c_2=0$, one of the roots is zero, whose log is undefined. If $c_1=0$ or $c_2=0$, Step 1400 exits the subroutine unsuccessfully. Otherwise Step 1402 determines a transformed root $Y_1$. If $Y_1$ is invalid, Step 1404 exits the subroutine unsuccessfully. Otherwise Step 1406 calculates the root X and its log L and returns successfully.

Figure 15:
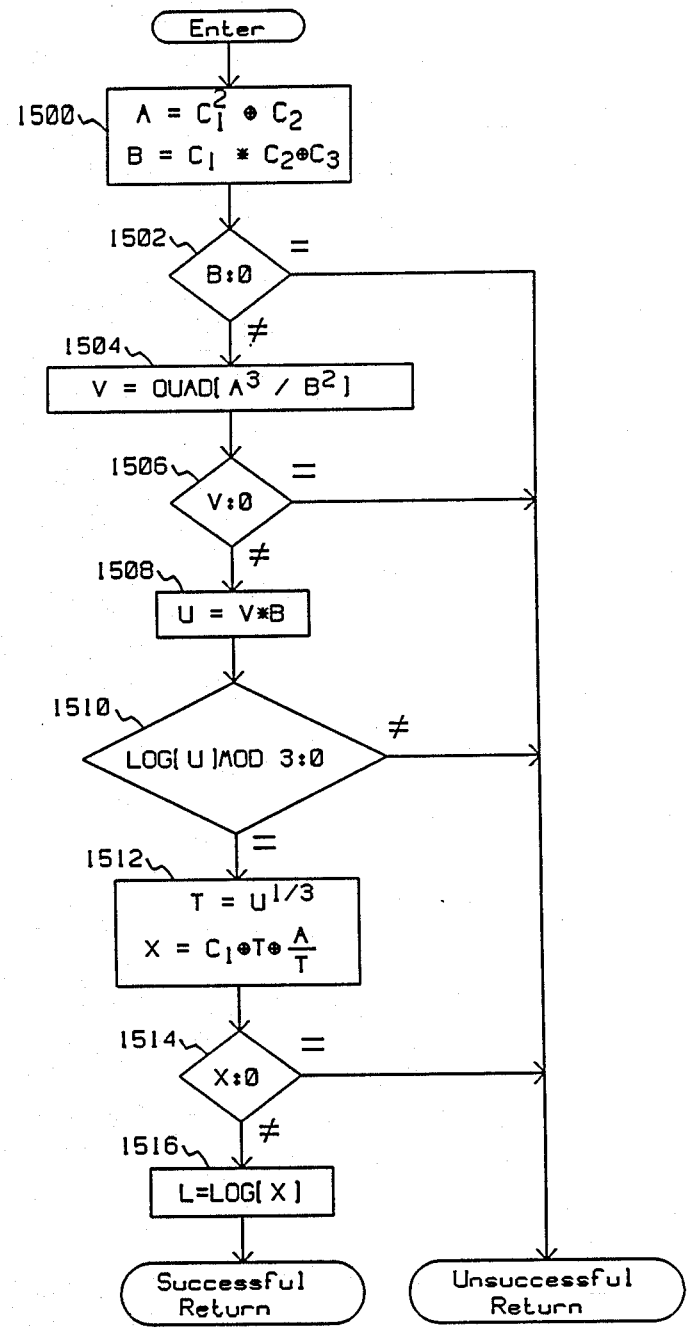
FIG. 15 illustrates the steps required to solve for a root X, and its log L, of a cubic equation in a finite field.

On entry to FIG. 15, the parameters $c_1$, $c_2$, and $c_3$ describe the cubic equation $$x^3 \oplus c_1*x^2 \oplus c_2*x \oplus c_3 = 0.$$

Step 1500 calculates the transform parameters A and B. If B is equal to zero, Step 1502 exits the subroutine unsuccessfully. Otherwise Step 1504 determines a root V of the quadratic equation $$v^2 \oplus *v \oplus \frac{A^3}{B^2} = 0.$$

using the QUAD table. If no such root exists, Step 1504 produces zero and Step 1506 exits the subroutine unsuccessfully. Otherwise Step 1508 computes U. If U is not the cube of some finite field value T, Step 1510 exits the subroutine unsuccessfully. Otherwise Step 1512 calculates T and a root X of the cubic equation. If X is equal to zero, Step 1514 exits the subroutine unsuccessfully. Otherwise Step 1516 calculates the log L of the root X and returns successfully.

Figure 16:
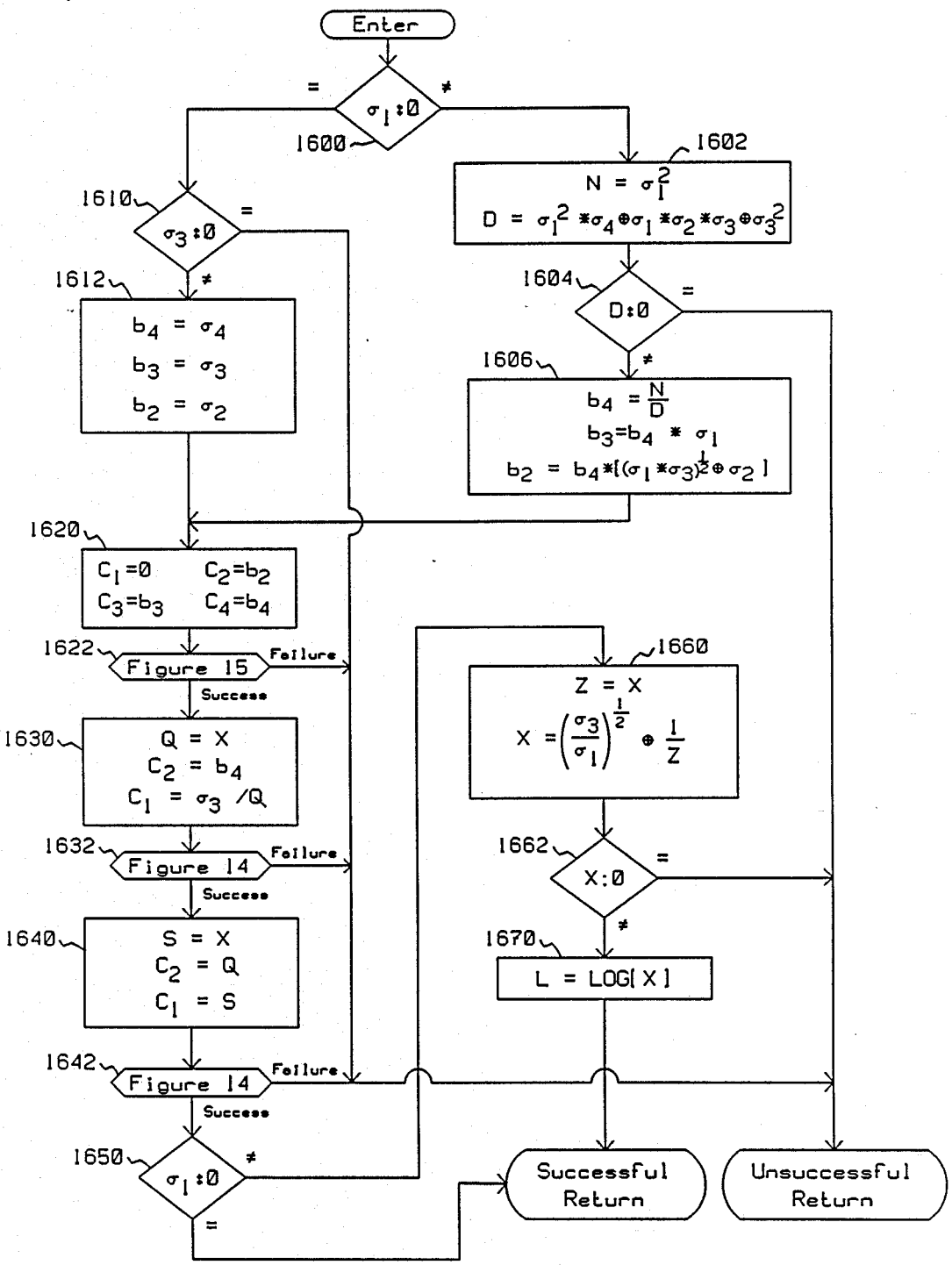
FIG. 16 illustrates the steps required to solve for the log L of one of the four roots of a quartic equation in a finite field.

On entry to FIG. 16, the parameters $\sigma_1$, $\sigma_2$, $\sigma_3$, and $\sigma_4$ describe the quartic equation $$x^4 \oplus \sigma_1*x^3 \oplus \sigma_2*x^2 \oplus \sigma_3*x \oplus \sigma_4 = 0.$$

If $\sigma_1$ is equal to zero, Step 1600 transfers contol to Step 1610; if $\sigma_3$ is equal to zero, the quartic equation has repeated roots, so Step 1610 exits the subroutine unsuccessfully. Otherwise Step 1612 assigns $b_i=\sigma_i$ for $i=2$ to 4 and transfers control to Step 1620. If $\sigma_1$ is not equal to zero, Step 1600 transfers control to Step 1602, which calculates the numerator and denominator of transform parameter $b_4$. If the denominator of $b_4$ is equal to zero, Step 1604 exits the subroutine unsuccessfully. Otherwise Step 1606 calculates the transform parameters $b_4$, $b_3$, and $b_2$ and transfers control to Step 1620.

Step 1620 sets parameters for and calls the cubic solution subroutine of FIG. 15. If this returns unsuccessfully, Step 1622 exits the subroutine unsuccessfully.

Otherwise Step 1630 assigns Q=X and sets parameters for and calls the quadratic solution subroutine of FIG. 14. If this returns unsuccessfully, Step 1632 exits the subroutine unsuccessfully. Otherwise Step 1640 sets parameters for and calls the quadratic solution subroutine of FIG. 14. If this returns unsuccessfully, Step 1642 exits the subroutine unsuccessfully. Otherwise if $\sigma_1$ is equal to zero, Step 1650 returns L successfully. Otherwise Step 1660 computes X. If X is equal to zero, Step 1662 exits the subroutine unsuccessfully. Otherwise Step 1670 computes and returns L successfully.

Figure 17:
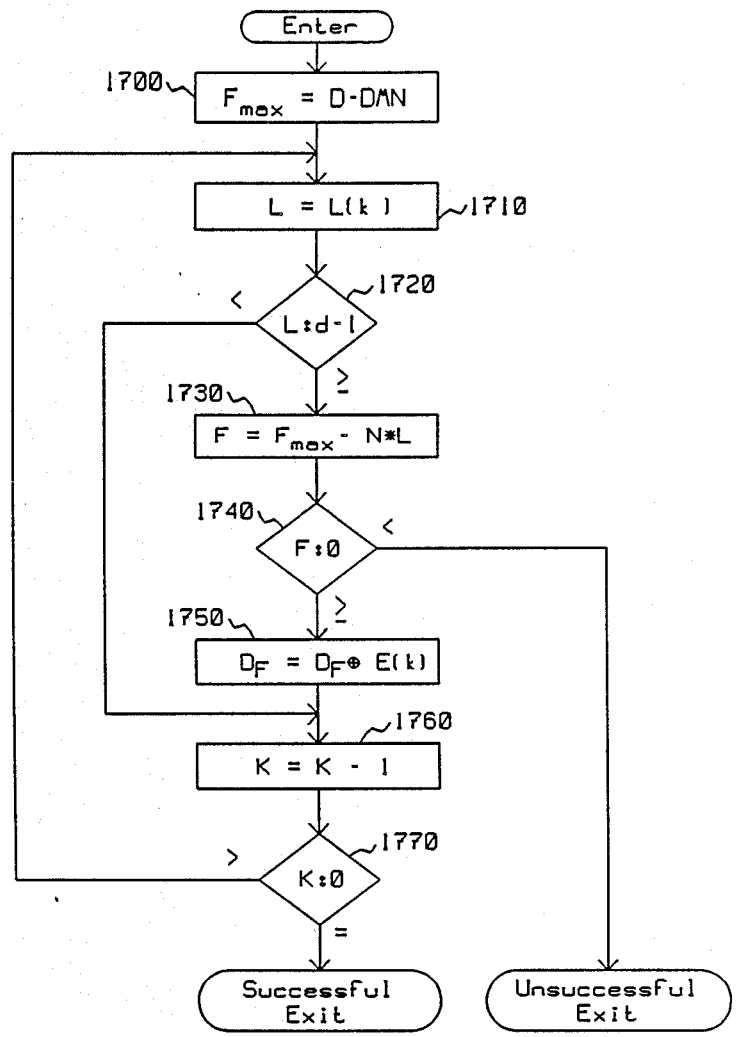
FIG. 17 illustrates the steps required to correct errors in interleaved codewords.

Referring to FIG. 17, on entry counter k is equal to the number of errors found, arrays L(*) and E(*) hold the pairs of error locations and values, D is the number of symbols in the data buffer and parameter DMN holds the reverse displacement plus one from the last symbol in the data buffer to the last data symbol in the current interleave. Step 1700 calculates the forward displacement from the first symbol in the data buffer to the last data symbol of the current interleave. Step 1710 fetches the location L=L(k) of the next error to be corrected. If L is less than d−1, the symbol in error is a check symbol and need not be corrected, so Step 1720 transfers control to 1760. Otherwise Step 1730 calculates a forward displacement F within the data buffer from the reverse displacement L within the codeword interleave based on the data buffer length and number of interleaved codewords. If F is less than zero and therefore invalid, Step 1740 exits the correction procedure unsuccessfully. Otherwise Step 1750 corrects the data symbol in error with the error value E(k). Step 1760 decrements counter k. If counter k is then still greater than zero, Step 1770 transfers control back to Step 1710 to correct additional errors. Otherwise all errors have been corrected and the correction procedure is exited successfully.

While the invention herein disclosed has been described by means of specific embodiments and applications thereof, numerous modifications and variations could be made thereto by those skilled in the art without departing from the spirit and scope of the present invention. It is therefore to be understood that within the scope of the appended claims, the invention may be practised otherwise than as specifically described herein.

What is claimed is:

1. A decoder for an error detection and correction system using a Reed-Solomon code or related code of degree d−1 for detection and correction of a plurality of errors in code words of n symbols comprised of k data symbols and d−1 check symbols, wherein each symbol is comprised of m binary bits of information and d, k, m, and n are positive integers, and further wherein t=INT((d−1)/2)≧3, said decoder comprising:

data buffer means for storing said k data symbols;
   remainder generator means for dividing a codeword polynomial C(x) by a generator polynomial G(x) of said code and producing a remainder polynomial R(x) having remainder coefficients $R_i$;
   remainder buffer means for storing said remainder coefficients $R_i$ produced by said remainder generator means;
   first table means comprising a table f(i,L) wherein each element is comprised of error correction information, and wherein 0≦i<d−1, and d−1<L<$2^m$−1; and
   processor means comprising means for accessing said remainder buffer to retrieve said remainder,
   means for applying said remainder to index said first table means and retrieve said correction information, and
   means for applying said correction information to said data symbols in said data buffer to correct symbols that are in error.

2. The decoder of claim 1 wherein each element of said first table means is comprised of a coefficient of the $x^i$ term of $x^L$ MOD G(x).

3. The decoder of claim 1 wherein each element of said first table means is comprised of a finite field logarithm of a coefficient of the $x^i$ term of $x^L$ MOD G(x).

4. The decoder of claim 1 further comprising a second table means comprising a table $L_{a,b}$ wherein each non-zero element is defined as $$L_{a,b}\left[\frac{f(b,L)}{f(a,L)}\right] = L$$

wherein f(i,L) is a coefficient of the $x^i$ term of $x^L$ MOD G(x), L varies from d−1 to $2^m$−2 and further wherein 0<a<d−1, 0<b<d−1, and a≠b.

5. The decoder of claim 1 further comprising a third table means comprising a table $L_{a,b}$ wherein each non-zero element is defined as $$L_{a,b}\left[\text{LOG}\left[\frac{f(b,L)}{f(a,L)}\right]\right] = L$$

wherein f(i,L) is a coefficient of the $x^i$ term of $x^L$ MOD G(x), LOG [f(b,L)/f(a,L)] is the finite field logarithm of f(b,L)/f(a,L), L varies from d−1 to $2^m$−2 and further wherein 0<a<d−1, 0≦b<d−1, and a≠b.

6. The decoder of claim 5 wherein said means for applying said remainder comprises:
   means for determining a location L of a data symbol error;
   means for calculating a value E of said data symbol error; and
   means for validating said location L and said value E of said data symbol error.

7. The decoder of claim 6 wherein said means for determining said location L comprises:
   means for calculating an index value $$\text{LOG}\left[\frac{R_b}{R_a}\right],$$

wherein $R_a$ and $R_b$ are two of said coefficients $R_i$;
   means for applying said index value to said third table means to retrieve said location L of said data symbol error.

8. The decoder of claim 6 wherein said means for determining said location L comprises:
   means for calculating L according to $$L = \text{LOG}\left[\frac{\alpha^a \oplus \alpha^b * \frac{G'_a}{G'_b} * \frac{R_b}{R_a}}{1 \oplus \frac{G'_a}{G'_b} * \frac{R_b}{R_a}}\right] \quad (13)$$

wherein $G_i'$ is a coefficient of the $x^i$ term of $$G'(x) = \prod_{i=0}^{d-3} (x \oplus \alpha^{m0+i}).$$

9. The decoder of claim 6 wherein said means for calculating said value E comprises:
   means for applying said location L to produce an index value for element f(a,L) of said first table means;
   means for applying said index value to said first table means to retrieve said element f(a,L); and
   means for dividing a coefficient $R_a$ by said element f(a,L) to produce said value E of said data symbol error.

10. The decoder of claim 6 wherein said means for validating said location L and said value E comprises
    means for calculating a finite field logarithm of said value E;
    means for testing a plurality t of said remainder coefficients $R_i$ wherein i≠a and i≠b, each test comprising a sequential repeated block comprising:
      means for adding said finite field logarithm of said error value E to an element f(i,L) of said first table means to produce a finite field logarithm of a test value;
      means for calculating a finite field antilogarithm of said finite logarithm of said test value; and
      means for comparing said finite field antilogarithm of said test value to said coefficient $R_i$;
    means for counting a number of said tests wherein said finite field antilogarithm of said test value is not equal to said remainder coefficient $R_i$;
    means for recording an indicium when said number is less than two; and
    means responsive to said indicium for using said location L and value E to correct said data symbol error.

11. The decoder of claim 5 wherein said means for applying said remainder comprises:
    means for computing parameters $\sigma_1$ and $\sigma_2$;
    means for determining locations $L_1$ and $L_2$ of two data symbol errors from $\sigma_1$ and $\sigma_2$;
    means for calculating values $E_1$ and $E_2$ of said two data symbol errors; and
    means for validating said locations and said values of said two data symbol errors.

12. The decoder of claim 11 wherein said means for computing said parameters $\sigma_1$ and $\sigma_2$ comprises:
    means computing non-zero parameters D, $N_1$, and $N_2$ according to $$N_1 = A_{ab}R_aR_b \oplus A_{ac}R_aR_c \oplus A_{ad}R_aR_d \oplus A_{bc}R_bR_c \oplus A_{bd}R_bR_d \oplus A_{cd}R_cR_d$$

$$N_2 = B_{ab}R_aR_b \oplus B_{ac}R_aR_c \oplus B_{ad}R_aR_d \oplus B_{bc}R_bR_c \oplus B_{bd}R_bR_d \oplus B_{cd}R_cR_d$$

$$D = C_{ab}R_aR_b \oplus C_{ac}R_aR_c \oplus C_{ad}R_aR_d \oplus C_{bc}R_bR_c \oplus C_{bd}R_bR_d \oplus C_{cd}R_cR_d$$

wherein pre-computed constants $A_{ab}$, $A_{ac}$, $A_{ad}$, $A_{bc}$, $A_{bd}$, $A_{cd}$, $B_{ab}$, $B_{ac}$, $B_{ad}$, $B_{bc}$, $B_{bd}$, $B_{cd}$, $C_{ab}$, $C_{ac}$, $C_{ad}$, $C_{bc}$, $C_{bd}$, and $C_{cd}$ are functions of a, b, c, and d given by:

$$A_{ab} = (\alpha^{2a} \oplus \alpha^{2b})*(G''_{c-1}*G''_d \oplus G''_c*G''_{d-1}),$$

$$A_{ac} = (\alpha^{2a} \oplus \alpha^{2c})*(G''_{b-1}*G''_d \oplus G''_b*G''_{d-1}),$$

$$A_{ad} = (\alpha^{2a} \oplus \alpha^{2d})*(G''_{b-1}*G''_c \oplus G''_b*G''_{c-1}),$$

$$A_{bc} = (\alpha^{2b} \oplus \alpha^{2c})*(G''_{a-1}*G''_d \oplus G''_a*G''_{d-1}),$$

$$A_{bd} = (\alpha^{2b} \oplus \alpha^{2d})*(G''_{a-1}*G''_c \oplus G''_a*G''_{c-1}),$$

$$A_{cd} = (\alpha^{2c} \oplus \alpha^{2d})*(G''_{a-1}*G''_b \oplus G''_a*G''_{b-1}),$$

$$B_{ab} = (\alpha^{a}*\alpha^{2b} \oplus \alpha^{b}*\alpha^{2a})*(G''_{c-1}*G''_d \oplus G''_c*G''_{d-1}),$$

$$B_{ac} = (\alpha^{a}*\alpha^{2c} \oplus \alpha^{c}*\alpha^{2a})*(G''_{b-1}*G''_d \oplus G''_b*G''_{d-1}),$$

$$B_{ad} = (\alpha^{a}*\alpha^{2d} \oplus \alpha^{d}*\alpha^{2a})*(G''_{b-1}*G''_c \oplus G''_b*G''_{c-1}),$$

$$B_{bc} = (\alpha^{b}*\alpha^{2c} \oplus \alpha^{c}*\alpha^{2b})*(G''_{a-1}*G''_d \oplus G''_a*G''_{d-1}),$$

$$B_{bd} = (\alpha^{b}*\alpha^{2d} \oplus \alpha^{d}*\alpha^{2b})*(G''_{a-1}*G''_c \oplus G''_a*G''_{c-1}),$$

$$B_{cd} = (\alpha^{c}*\alpha^{2d} \oplus \alpha^{d}*\alpha^{2c})*(G''_{a-1}*G''_b \oplus G''_a*G''_{b-1}),$$

$$C_{ab} = (\alpha^a \oplus \alpha^b)*(G''_{c-1}*G''_d \oplus G''_c*G''_{d-1}),$$

$$C_{ac} = (\alpha^a \oplus \alpha^c)*(G''_{b-1}*G''_d \oplus G''_b*G''_{d-1}),$$

$$C_{ad} = (\alpha^a \oplus \alpha^d)*(G''_{b-1}*G''_c \oplus G''_b*G''_{c-1}),$$

$$C_{bc} = (\alpha^b \oplus \alpha^c)*(G''_{a-1}*G''_d \oplus G''_a*G''_{d-1}),$$

$$C_{bd} = (\alpha^b \oplus \alpha^d)*(G''_{a-1}*G''_c \oplus G''_a*G''_{c-1}),$$

$$C_{cd} = (\alpha^c \oplus \alpha^d)*(G''_{a-1}*G''_b \oplus G''_a*G''_{b-1}),$$

and $G_i''$ is a coefficient of the $x^i$ term of $$G''(x) = \prod_{i=0}^{d-4} (x \oplus \alpha^{m0+i})$$

with $G_{-1}''$ defined as zero; and
means for computing $\sigma_1 = N_1/D$ and $\sigma_2 = N_2/D$.

13. The decoder of claim 11 wherein t≧4 and selected coefficients $R_a$, $R_b$, $R_c$, and $R_d$ of said coefficients $R_i$ are each not equal to zero.

14. The decoder of claim 11 wherein said means for calculating said values $E_1$ and $E_2$ of said two data symbol errors comprises:
    means for computing non-zero parameters D, $N_1$, and $N_2$ according to $$D = f(a,L_1)*f(b,L_2) \oplus f(b,L_1)*f(a,L_2);$$

$$N_1 = R_a*f(b,L_2) \oplus R_b*f(a,L_2),$$

$$N_2 = R_a*f(b,L_1) \oplus R_b*f(a,L_1); \text{ and}$$

means for computing $E_1 = N_1/D$ and $E_2 = N_2/D$.

15. The decoder claim 11 wherein said means for validating said locations and said values comprises:
    means for calculating finite field logarithms of said values $E_1$ and $E_2$;
    means for testing a plurality t−2 of said remainder coefficients $R_i$ wherein i≠a, i≠b, i≠c, and i≠d, each test comprising a sequential repeated block comprising:
      means for adding said finite field logarithms of said values $E_1$ and $E_2$ to respective elements $f(i,L_1)$ and $f(i,L_2)$ of said first table means to produce finite field logarithms of test values,
      means for calculating finite field antilogarithms of said finite field logarithms of said test values;

means for calculating an EXCLUSIVE-OR sum of said finite field antilogarithms of said test values; and means for comparing said EXCLUSIVE-OR sum of said finite field antilogarithms of said test values to said coefficient $R_i$;

means for recording an indicium when each said EXCLUSIVE-OR sum of said finite field antilogarithms of said test values is equal to said coefficient $R_i$; and means responsive to said indicium for using said locations and values to correct said data symbol errors.

16. The decoder of claim 1 wherein said means for applying said remainder comprises:

means for counting a number of non-zero coefficients $R_i$ in a plurality of $t+1$ of said coefficients $R_i$ in said remainder buffer and recording an indicium when said number is less than three; and means responsive to said indicium for terminating error correction successfully.

17. The decoder of claim 1 wherein said means for applying said remainder comprises:

means for validating locations $L_j$ and values $E_j$ of e errors comprising means for testing a plurality of said remainder coefficients $R_i$ according to the equations $$R_i = \sum_{j=1}^{e} o\ E_j * f(i, L_j).$$

18. The decoder of claim 1 wherein said processor means comprises:

means for computing a syndrome polynomial $S(x)$ from said remainder polynomial $R(x)$;

means for generating an error location polynomial $\sigma(x)$ from said syndrome polynomial $S(x)$;

means responsive to said error locator polynomial $\sigma(x)$ for locating errors; and means responsive to said error locator polynomial $\sigma(x)$ and said syndrome polynomial $S(x)$ for evaluating errors.

19. The decoder of claim 18 wherein said means for computing said syndrome polynomial comprises:

(1) means for initializing a coefficient $S_0$ and all other coefficients $S_i$ of said syndrome polynomial $S(x)$ to a coefficient $R_0$ of said remainder polynomial $R(x)$;

(2) means for initializing a counter j to 1;

(3) means for computing a finite field logarithmic partial result comprising a MODULO $2^m - 1$ sum of a finite field logarithm of a non-zero coefficient $R_j$ and $j*m_0$;

(4) means for calculating a finite field antilogarithm of said partial result;

(5) means for EXCLUSIVE-OR adding said finite field antilogarithm of said partial result to said coefficient $S_0$;

(6) means for MODULO $2^m - 1$ adding said counter j to said partial result;

(7) means for calculating a finite field antilogarithm of said partial result;

(9) means for EXCLUSIVE-OR adding said finite field antilogarithm of said MODULO $2^m - 1$ sum and one of said coefficients $S_i$;

(10) means for repeating said means (6) through (9) for said coefficients $S_i$ wherein $i = 2$ to MIN($d-2, 11$);

(11) means for incrementing said counter j; and

(12) means for repeating said means (3) through (11) for said coefficients $R_j$ wherein $j = 2$ to $d - 2$.

20. The decoder of claim 18 wherein said means for generating said error locator polynomial comprises:

means for computing an nth discrepancy $d_n$ comprising sequential repeated blocks, each said block comprising means for calculating a MODULO $2^m - 1$ sum of said nth discrepancy $d_n$ and a finite field product of a coefficient $\sigma_{pi}$ and a coefficient $S_{n-i}$;

means using a degree $l_n$ of the nth error locator polynomial as an index into a table of software addresses of each said block;

means for recording an indicium when said parameter n is equal to twelve; and means responsive to said indicium for generating coefficients $S_i$ for $i = 11$ to $d - 2$.

21. The decoder of claim 18 wherein said means for locating said errors comprises:

means for recording an indicium when said error locator polynomial $\sigma(x)$ is of degree j greater than four;

means responsive to said indicium for locating one of said errors comprising evaluating said error locator polynomial $\sigma(x)$ for successive values of L until $$A = \alpha^{jL} * \sigma(x)|_{\alpha - L} = 0,$$

said means for evaluating comprising a sequence of repeated blocks each said block comprising means for calculating a finite field product of $\alpha^{-L}$ and an EXCLUSIVE-OR sum of said parameter A and a coefficient $\sigma_i$ of said error locator polynomial $\sigma(x)$; and means for maintaining a software address of a starting point for next said evaluation.

22. The decoder of claim 18 wherein said means for locating said errors comprises:

means for recording an indicium when said error locator polynomial $\sigma(x)$ is of degree j less than or equal to four; and means responsive to said indicium for locating one of said errors comprising:

means for calculating a finite field logarithm of a root of a quartic equation in a finite field;

means for calculating a root and a finite field logarithm of said root of a cubic equation in a finite field;

means for calculating a root and a finite field logarithm of said root of a quadratic equation in a finite field; and means for calculating a finite field logarithm of a root of a linear equation in a finite field.

23. The decoder of claim 18 wherein said means for evaluating said errors comprises:

means for dividing said error locator polynomial $\sigma(x)$ by $(x \oplus \alpha^L)$ to produce a new error locator polynomial $\sigma(x)$ and calculating an error value E from said syndrome polynomial $S(x)$ and said new error locator polynomial $\sigma(x)$, comprising a single software loop comprising:

(1) means for initializing a counter $g = 1$, a remainder $R = 1$, a denominator $D = 1$, and a numerator $N = \sigma_j$;

(2) means for calculating a MODULO $2^m - 1$ sum of said remainder R and a finite field product of a finite field antilogarithm of said location L and said remainder R;

(3) means for storing said MODULO $2^m-1$ sum as said remainder R and as a coefficient $\sigma_g$ of said error locator polynomial $\sigma(x)$;

(4) means for calculating a MODULO $2^m-1$ sum of said remainder R and a finite field product of a finite field antilogarithm of said location L and said denominator D;

(5) means for storing said MODULO $2^m-1$ sum as said denominator D;

(6) means for calculating a MODULO $2^m-1$ sum of said numerator N and a finite field product of said remainder R and a coefficient $S_{j-g}$ of said syndrome polynomial S(x);

(7) means for storing said MODULO $2^m-1$ sum as said numerator N;

(8) means for incrementing said counter g; and (9) means for repeating said means (2) through (8) for values of said counter g up to and including j;

means for recording an indicium when R, D, or N is equal to zero after the operation of said means (1) through (9);

means responsive to said indicium for terminating error correction unsuccessfully;

means for calculating a finite field quotient of said numerator N and said denominator D;

means for recording a finite field logarithm of said finite field quotient as a parameter E';

means for calculating a finite field product of said finite field quotient and a finite field antilogarithm of $-L*m_0$;

means for recording said finite field product as said error value E; and means for adjusting coefficients of said syndrome polynomial S(x) comprising a software loop comprising:

(a) means for initializing a counter g=0;

(b) means for calculating a finite field antilogarithm of said parameter E';

(c) means for calculating a MODULO $2^m-1$ sum of said finite field antilogarithm and a coefficient $S_i$ of said syndrome polynomial S(x);

(d) means for storing said MODULO $2^m-1$ sum as said coefficient $S_i$;

(e) means for calculating a MODULO $2^m-1$ sum of said parameter E' and said location L;

(f) means for storing said MODULO $2^m-1$ sum as said parameter E';

(g) means for incrementing said counter g; and (h) means for repeating said means (b) through (g) for values of said counter g up to and including j.

24. The decoder of claim 1 wherein m=8, t=8, G(x) is a GF(256) polynomial $$G(x) = \prod_{i=0}^{15} (x \oplus \alpha^i),$$

and $\alpha^i$ are elements of a finite field generated by a GF(2) polynomial $$x^8 \oplus x^4 \oplus x^3 \oplus x^2 \oplus 1.$$

25. The decoder of claim 1 wherein m=8, t=8, G(x) is a GF(256) polynomial $$G(x) = \prod_{i=0}^{15} (x \oplus \alpha^{m_0+i}),$$

$m_0=120$, and $\alpha^i$ are given by $$\alpha^i = (beta^i)^{88},$$

wherein $beta^i$ are elements of a finite field generated by a GF(2) polynomial $$x^8 \oplus x^5 \oplus x^3 \oplus x^2 \oplus 1.$$

26. The decoder of claim 1 wherein m=8, t=4, G(x) is a GF(256) polynomial $$G(x) = \prod_{i=0}^{7} (x \oplus \alpha^{m_0+i}),$$

$m_0=124$, and $\alpha^i$ are given by
$$\alpha^i = (beta^i)^{88},$$
wherein $beta^i$ are elements of a finite field generated by a GF(2) polynomial $$x^8 \oplus x^5 \oplus x^3 \oplus x^2 \oplus 1.$$

27. The decoder of claim 1 wherein m=8, t=2, G(x) is a GF(256) polynomial $$G(x) = \prod_{i=0}^{3} (x \oplus \alpha^{m_0+i}),$$

$m_0=126$, and $\alpha^i$ are given by $$\alpha^i = (beta^i)^{88},$$

wherein $beta^i$ are elements of a finite field generated by a GF(2) polynomial $$x^8 \oplus x^5 \oplus x^3 \oplus x^2 \oplus 1.$$

28. In a decoder for an error detection and correction system using a Reed-Solomon code or related code of degree d−1 for detection and correction of a plurality of errors in codewords of n symbols comprised of k data symbols and d−1 check symbols, wherein each symbol is comprised of m binary bits of information and d, k, m, and n are positive integers, and further wherein t=INT((d−1)/2)≧3, an error decoding method comprising the steps of:

storing said k data symbols in a data buffer;

generating a remainder polynomial R(x) having remainder coefficients $R_i$ by dividing a codeword polynomial C(x) by a generator polynomial G(x) of said code;

storing said remainder coefficients in a remainder buffer;

applying said remainder coefficients to index a first table f(i,L), each element of said table being comprised of a coefficient of the $x^i$ term of $x^L$ MOD G(x) wherein L varies from d−1 to $2^m-2$ and i varies from 0 to d−2, to produce correction information;

applying said correction information to said data symbols in said data buffer to correct symbols that are in error.

29. The method of claim 28 wherein said step of applying said remainder coefficients further comprises the steps of:
   counting a number of non-zero coefficients $R_i$ in a plurality $t+2$ of said coefficients $R_i$ in said remainder buffer; and
   terminating error correction successfully when said number is less than three.

30. The method of claim 28 wherein said step of applying said remainder coefficients further comprises the steps of:
   determining a location L of a data symbol error;
   calculating a value E of said data symbol error; and
   validating said location L and said value E of said data symbol error.

31. The method of claim 30 wherein said step of determining said location L comprises the steps of:
   calculating an index value from two coefficients $R_a$ and $R_b$ of said coefficients $R_i$:

$$\text{LOG}\left[\frac{R_b}{R_a}\right]; \text{ and}$$

applying said index value to a second table $L_{a,b}$ wherein each non-zero element is given by $$L_{a,b}\left[\text{LOG}\left[\frac{f(b,L)}{f(a,L)}\right]\right] = L$$

for $L = d-1$ to $2^m - 1$ to retrieve said location L of said data symbol error.

32. The method of claim 30 wherein said step of determining said location L comprises calculating L according to $$L = \text{LOG}\left[\frac{\alpha^a \oplus \alpha^b * \frac{G_a'}{G_b'} * \frac{R_b}{R_a}}{1 \oplus \frac{G_a'}{G_b'} * \frac{R_b}{R_a}}\right] \quad (13)$$

wherein $G_i'$ is a coefficient of the $x^i$ term of $$G'(x) = \prod_{i=0}^{d-3} (x \oplus \alpha^{m0+i}).$$

33. The method of claim 30 wherein said step of calculating said value E comprises the steps of:
   using said location L and a number a wherein $0 \leq a < d-1$ to produce an index value for an element $f(a,L)$ of said first table;
   retrieving said element $f(a,L)$ of said first table referenced by said index value;
   dividing a coefficient $R_a$ by said element $f(a,L)$ to produce said value E of said data symbol error.

34. The method of claim 30 wherein said step of validating said location L and said value E comprises the steps of:
   calculating a finite field logarithm of said value E;
   testing a plurality t of said remainder coefficients $R_i$ wherein $i \neq a$ and $i \neq b$, each test comprising a sequential repeated block comprising the steps of:
   adding said finite field logarithm of said error value E to an element $f(i,L)$ of said first table to produce a finite field logarithm of a test value;
   calculating a finite field antilogarithm of said finite field logarithm of said test value; and
   comparing said finite field antilogarithm of said test value to said coefficient $R_i$;
   counting a number of said tests wherein said finite finite field antilogarithm of said test value is not equal to said remainder coefficient $R_i$; and
   correcting said data symbol error using said location L and said value E when said number is less than two.

35. The method of claim 28 wherein said step of applying said remainder coefficients further comprises the steps of:
   computing parameters $\sigma_1$ and $\sigma_2$;
   determining locations $L_1$ and $L_2$ of two data symbol errors from $\sigma_1$ and $\sigma_2$;
   calculating values $E_1$ and $E_2$ of said two data symbol errors; and
   validating said locations and said values of said two data symbol errors.

36. The method of claim 35 wherein said step of computing said parameters $\sigma_1$ and $\sigma_2$ comprises the steps of:
   computing non-zero parameters D, $N_1$, and $N_2$ according to $$N_1 = A_{ab}R_aR_b \oplus A_{ac}R_aR_c \oplus A_{ad}R_aR_d \oplus A_{bc}R_bR_c \oplus A_{bd}R_bR_d \oplus A_{cd}R_cR_d$$

$$N_2 = B_{ab}R_aR_b \oplus B_{ac}R_aR_c \oplus B_{ad}R_aR_d \oplus B_{bc}R_bR_c \oplus B_{bd}R_bR_d \oplus B_{cd}R_cR_d$$

$$D = C_{ab}R_aR_b \oplus C_{ac}R_aR_c \oplus C_{ad}R_aR_d \oplus C_{bc}R_bR_c \oplus C_{bd}R_bR_d \oplus C_{cd}R_cR_d$$

wherein pre-computed constants $A_{ab}$, $A_{ac}$, $A_{ad}$, $A_{bc}$, $A_{bd}$, $A_{cd}$, $B_{ab}$, $B_{ac}$, $B_{ad}$, $B_{bc}$, $B_{bd}$, $B_{cd}$, $C_{ab}$, $C_{ac}$, $C_{ad}$, $C_{bc}$, $C_{bd}$, and $C_{cd}$ are functions of a, b, c, and d given by:

$$A_{ab} = (\alpha^{2a} \oplus \alpha^{2b}) * (G''_{c-1} * G''_d \oplus G''_c * G''_{d-1}),$$

$$A_{ac} = (\alpha^{2a} \oplus \alpha^{2c}) * (G''_{b-1} * G''_d \oplus G''_b * G''_{d-1}),$$

$$A_{ad} = (\alpha^{2a} \oplus \alpha^{2d}) * (G''_{b-1} * G''_c \oplus G''_b * G''_{c-1}),$$

$$A_{bc} = (\alpha^{2b} \oplus \alpha^{2c}) * (G''_{a-1} * G''_d \oplus G''_a * G''_{d-1}),$$

$$A_{bd} = (\alpha^{2b} \oplus \alpha^{2d}) * (G''_{a-1} * G''_c \oplus G''_a * G''_{c-1}),$$

$$A_{cd} = (\alpha^{2c} \oplus \alpha^{2d}) * (G''_{a-1} * G''_b \oplus G''_a * G''_{b-1}),$$

$$B_{ab} = (\alpha^a * \alpha^{2b} \oplus \alpha^b * \alpha^{2a}) * (G''_{c-1} * G''_d \oplus G''_c * G''_{d-1}),$$

$$B_{ac} = (\alpha^a * \alpha^{2c} \oplus \alpha^c * \alpha^{2a}) * (G''_{b-1} * G''_d \oplus G''_b * G''_{d-1}),$$

$$B_{ad} = (\alpha^a * \alpha^{2d} \oplus \alpha^d * \alpha^{2a}) * (G''_{b-1} * G''_c \oplus G''_b * G''_{c-1}),$$

$$B_{bc} = (\alpha^b * \alpha^{2c} \oplus \alpha^c * \alpha^{2b}) * (G''_{a-1} * G''_d \oplus G''_a * G''_{d-1}),$$

$$B_{bd} = (\alpha^b * \alpha^{2d} \oplus \alpha^d * \alpha^{2b}) * (G''_{a-1} * G''_c \oplus G''_a * G''_{c-1}),$$

$$B_{cd} = (\alpha^c * \alpha^{2d} \oplus \alpha^d * \alpha^{2c}) * (G''_{a-1} * G''_b \oplus G''_a * G''_{b-1}),$$

$$C_{ab} = (\alpha^a \oplus \alpha^b) * (G''_{c-1} * G''_d \oplus G''_c * G''_{d-1}),$$

-continued $$C_{ac} = (\alpha^a \oplus \alpha^c) * (G''_{b-1} * G''_d \oplus G''_b * G''_{d-1}),$$

$$C_{ad} = (\alpha^a \oplus \alpha^d) * (G''_{b-1} * G''_c \oplus G''_b * G''_{c-1}),$$

$$C_{bc} = (\alpha^b \oplus \alpha^c) * (G''_{a-1} * G''_d \oplus G''_a * G''_{d-1}),$$

$$C_{bd} = (\alpha^b \oplus \alpha^d) * (G''_{a-1} * G''_c \oplus G''_a * G''_{c-1}),$$

$$C_{cd} = (\alpha^c \oplus \alpha^d) * (G''_{a-1} * G''_b \oplus G''_a * G''_{b-1}),$$

and $G_i''$ is a coefficient of the $x^i$ term of $$G''(x) = \prod_{i=0}^{d-4} (x \oplus \alpha^{m_0+i})$$

with $G''_{-1}$ defined as zero; and computing $\sigma_1 = N_1/D$ and $\sigma_2 = N_2/D$.

37. The method of claim 35 wherein $t > 4$ and selected coefficients $R_a$, $R_b$, $R_c$, and $R_d$ of said coefficients $R_i$ are each not equal to zero.

38. The method of claim 35 wherein said step of calculating said values $E_1$ and $E_2$ of said two data symbol errors comprises the steps of:
computing non-zero parameters D, $N_1$, and $N_2$ according to $$D = f(a,L_1)*f(b,L_2) \oplus f(b,L_1)*f(a,L_2);$$

$$N_1 = R_a*f(b,L_2) \oplus R_b*f(a,L_2),$$

$$N_2 = R_a*f(b,L_1) \oplus R_b*f(a,L_1),$$

wherein $R_a$, $R_b$, $R_c$, and $R_d$ are selected coefficients of said coefficients $R_i$; and computing $E_1 = N_1/D$ and $E_2 = N_2/D$.

39. The method of claim 35 wherein said step of validating said locations and said values of said two data symbol errors comprises the steps of:
calculating finite field logarithms of said values $E_1$ and $E_2$;
testing a plurality $t-2$ of said remainder coefficients $R_i$ wherein $i \neq a$, $i \neq b$, $i \neq c$, and $i \neq d$, and further wherein each test comprises a sequential repeated block comprising the steps of:
adding said finite field logarithms of said values $E_1$ and $E_2$ to respective elements $f(i,L_1)$ and $f(i,L_2)$ of said first table to produce finite field logarithms of test values;
calculating finite field antilogarithms of said finite field logarithms of said test values;
calculating an EXCLUSIVE-OR sum of said finite field antilogarithms of said test values;
comparing said EXCLUSIVE-OR sum of said finite field antilogarithms of said test values to said coefficient $R_i$;
correcting said two data symbol errors using said locations and values when each said EXCLUSIVE-OR sum of said finite field antilogarithms of said test values is equal to said coefficient $R_i$.

40. The method of claim 28 wherein said step of applying said remainder coefficients further comprises validating locations $L_j$ and values $E_j$ of a plurality e of symbol errors by testing a plurality of said remainder coefficients $R_i$ according to the equations $$R_i = \sum_{j=1}^{e} o\, E_j * f(i,L_j).$$

41. The method of claim 28 wherein said step of applying said remainder coefficients further comprises the steps of:
computing a syndrome polynomial $S(x)$ from said remainder polynomial $R(x)$;
generating an error locator polynomial $\sigma(x)$ from said syndrome polynomial $S(x)$;
locating errors using said error locator polynomial $\sigma(x)$; and
evaluating errors using said error locator polynomial $\sigma(x)$ and said syndrome polynomial $S(x)$.

42. The method of claim 41 wherein said step of computing said syndrome polynomial comprises the steps of:
(1) initializing a coefficient $S_0$ and all other coefficients $S_i$ of said syndrome polynomial $S(x)$ to a coefficient $R_0$ of said remainder polynomial $R(x)$;
(2) initializing a counter j to 1;
(3) computing a finite field logarithmic partial result comprising a MODULO $2^m - 1$ sum of a finite field logarithm of a non-zero coefficient $R_j$ and $j*m_0$;
(4) calculating a finite field antilogarithm of said partial result;
(5) EXCLUSIVE-OR adding said finite field antilogarithm of said partial result to said coefficient $S_0$;
(6) MODULO $2^m - 1$ adding said counter j to said partial result;
(7) calculating a finite field antilogarithm of said partial result;
(9) EXCLUSIVE-OR adding said finite field antilogarithm of said MODULO $2^m - 1$ sum and one of said coefficients $S_i$;
(10) repeating said steps (6) through (9) for said coefficients $S_i$ wherein $i = 2$ to MIN(d−2,11);
(11) incrementing said counter j; and
(12) repeating said steps (3) through (11) for said coefficients $R_j$ wherein $j = 2$ to $d - 2$.

43. The method of claim 41 wherein said step of generating said error locator polynomial comprises the steps of:
computing an nth discrepancy $d_n$ using sequential repeated blocks, each said block comprising calculating a MODULO $2^m - 1$ sum of said nth discrepancy $d_n$ and finite field product of a coefficient $\sigma_{pi}$ and a coefficient $S_{n-i}$;
using a degree $l_n$ of an nth error locator polynomial $\sigma(x)$ as an index into a table of software addresses of each said block;
generating coefficients $S_i$ for $i = 11$ to $d - 2$ when said parameter is equal to twelve.

44. The method of claim 41 wherein said step of locating said errors when said error locator polynomial $\sigma(x)$ is of degree j greater than four comprises the steps of:
evaluating said error locator polynomial $\sigma(x)$ for successive values of L until $$A = \alpha^{jL} * \sigma(x) |_{\alpha - L} = 0,$$

said step of evaluating comprising a sequence of repeated blocks, each said block comprising calculating a finite field product of $\alpha^{-L}$ and an EXCLU- SIVE-OR sum of said parameter A and a coefficient $\sigma_i$ of said error locator polynomial $\sigma(x)$; and maintaining a software address of a starting point for next said evaluation.

45. The method of claim 41 wherein said step of locating said errors when said error locator polynomial $\sigma(x)$ is of degree j less than or equal to four comprises locating one of said errors using one of the steps of:

when j is equal to four, calculating a finite field logarithm of a root of a quartic equation in a finite field;

when j is equal to three, calculating a root and a finite field logarithm of said root of a cubic equation in a finite field;

when j is equal to two, calculating a root and a finite field logarithm of said root of a quadratic equation in a finite field; or when j is equal to one, calculating a finite field logarithm of a root of a linear equation in a finite field.

46. The method of claim 41 wherein said step of evaluating said errors comprises the steps of:

dividing said error locator polynomial $\sigma(x)$ by $(x \oplus \alpha^L)$ to produce a new error locator polynomial S(x) and calculating an error value E from said syndrome polynomial S(x) and said new error locator polynomial $\sigma(x)$, all in a single software loop comprising steps of:

(1) initializing a counter g=1, a remainder R=1, a denominator D=1, and a numerator N=$\sigma_j$;

(2) calculating a MODULO $2^m - 1$ sum of said remainder R and a finite field product of a finite field antilogarithm of said location L and said remainder R;

(3) storing said MODULO $2^m - 1$ sum as said remainder R and as a coefficient $\sigma_g$ of said error locator polynomial $\sigma(x)$;

(4) calculating a MODULO $2^m - 1$ sum of said remainder R and a finite field product of a finite field antilogarithm of said location L and said denominator D;

(5) storing said MODULO $2^m - 1$ sum as said denominator D;

(6) calculating a MODULO $2^m - 1$ sum of said numerator N and a finite field product of said remainder R and a coefficient $S_{j-g}$ of said syndrome polynomial S(x);

(7) storing said MODULO $2^m - 1$ sum as said numerator N;

(8) incrementing said counter g; and (9) repeating said steps (2) through (8) for values of said counter g up to and including j;

terminating error correction unsuccessfully when R, D, or N is equal to zero after completion of said steps (1) through (9);

calculating a finite field quotient of said numerator N and said denominator D;

recording said a finite field logarithm of said finite field quotient as a parameter E';

calculating a finite field product of said finite field quotient and a finite field antilogarithm of $-L*m_0$;

recording said finite field product as said error value E; and adjusting coefficients of said syndrome polynomial S(x) using steps of:

(a) initializing counter g=0;

(b) calculating a finite field antilogarithm of said parameter E';

(c) calculating a MODULO $2^m - 1$ sum of said finite field antilogarithm and a coefficient $S_i$ of said syndrome polynomial S(x);

(d) storing said MODULO $2^m - 1$ sum as said coefficient $S_i$;

(e) calculating a MODULO $2^m - 1$ sum of said parameter E' and said location L;

(f) storing said MODULO $2^m - 1$ sum as said parameter E';

(g) incrementing said counter g; and (h) repeating said steps (b) through (g) for values of said counter g up to and including j.

47. In a decoder for an error detection and correction system using a Reed-Solomon code or related code of degree d−1 for detection and correction of a plurality of errors wherein a message block is comprised of N interleaved codewords of said code wherein codeword i is comprised of $n_i − (d−1)$ data symbols and d−1 check symbols comprising a total of D data symbols stored in a data buffer means and N*(d−1) check symbols stored in a remainder buffer means where d, i, N, and $n_i$ are positive integers, and further wherein the first check symbol in said remainder buffer means is remainder coefficient $R_{d-2}$ of codeword D MOD N and the last symbol in said remainder buffer means is remainder coefficient $R_0$ of codeword (D−1) MOD N, with other coefficients interleaved between, a method for accessing said data buffer means and said remainder buffer means for detection and correction of said errors comprising the steps of:

(1) initializing a parameter DMN equal to said number of data symbols D MODULO said number of interleaves N and initializing a counter I to zero;

(2) if said parameter DMN is equal to zero, resetting said parameter DMN to said number of interleaves N;

(3) computing a forward displacement within said remainder buffer means of coefficient $R_0$ of codeword I by calculating N*(d−1)−DMN;

(4) computing forward displacements within said remainder buffer means of other coefficients $R_i$ of said codeword I by repeated subtraction of said number of interleaves N from said forward displacement of said coefficient $R_0$ of said codeword I;

(5) determining location(s) $L_i$ and value(s) $E_i$ of error(s) in said codeword I;

(6) computing a forward displacement within said data buffer means of a last data symbol within said codeword I as $F_{max}$=d−DMN;

(7) computing a forward displacement within said data buffer means of an error at a location $L_i > d−1$ as $F_i = F_{max} − N*L_i$;

(8) correcting said error at said forward displacement $F_i$ using error value $E_i$;

(9) repeating said steps (7) and (8) for all errors in said codeword I;

(10) decrementing said parameter DMN and incrementing said counter I; and

(11) repeating said steps (2) through (10) for values of said counter I up to and including N−1.

* * * * *